(12) United States Patent
Chen et al.

(10) Patent No.: US 11,647,578 B2
(45) Date of Patent: May 9, 2023

(54) LITHOGRAPHY THERMAL CONTROL

(71) Applicant: Taiwan Semiconductor Manufacturing Co., Ltd., Hsinchu (TW)

(72) Inventors: Tai-Yu Chen, Hsinchu (TW); Cho-Ying Lin, Hsinchu (TW); Sagar Deepak Khivsara, Hsinchu (TW); Hsiang Chen, Hsinchu (TW); Chieh Hsieh, Hsinchu (TW); Sheng-Kang Yu, Hsinchu (TW); Shang-Chieh Chien, Hsinchu (TW); Kai Tak Lam, Hsinchu (TW); Li-Jui Chen, Hsinchu (TW); Heng-Hsin Liu, Hsinchu (TW); Zhiqiang Wu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 65 days.

(21) Appl. No.: 17/462,563

(22) Filed: Aug. 31, 2021

(65) Prior Publication Data
US 2023/0065403 A1 Mar. 2, 2023

(51) Int. Cl.
*H05G 2/00* (2006.01)
*G03F 7/20* (2006.01)

(52) U.S. Cl.
CPC ......... *H05G 2/008* (2013.01); *G03F 7/70033* (2013.01); *G03F 7/7055* (2013.01); *G03F 7/7085* (2013.01); *H05G 2/006* (2013.01)

(58) Field of Classification Search
CPC .... H05G 2/008; H05G 2/006; G03F 7/70033; G03F 7/7055; G03F 7/7085
See application file for complete search history.

(56) References Cited

U.S. PATENT DOCUMENTS

2014/0126043 A1* 5/2014 Senekerimyan ....... H05G 2/008
359/361

* cited by examiner

*Primary Examiner* — Nicole M Ippolito
*Assistant Examiner* — Hanway Chang
(74) *Attorney, Agent, or Firm* — Seed IP Law Group LLP

(57) ABSTRACT

A light source is provided capable of maintaining the temperature of a collector surface at or below a predetermined temperature. The light source in accordance with various embodiments of the present disclosure includes a processor, a droplet generator for generating a droplet to create extreme ultraviolet light, a collector for reflecting the extreme ultraviolet light into an intermediate focus point, a light generator for generating pre-pulse light and main pulse light, and a thermal image capture device for capturing a thermal image from a reflective surface of the collector.

20 Claims, 18 Drawing Sheets

LITHOGRAPHY THERMAL CONTROL

BACKGROUND

To produce semiconductor devices, a semiconductor substrate, such as a silicon wafer, which is a raw material for the semiconductor devices, must go through a sequence of complicated and precise process steps. Often, to complete the sequence, the wafer must be physically transported from one piece of fabrication equipment to another piece of fabrication equipment. Within these pieces of fabrication equipment, various processes such as diffusion, ion implantation, chemical vapor deposition, photolithography, etching, physical vapor deposition, and chemical mechanical polishing are carried out on the semiconductor substrate.

Photolithography, also called optical lithography or lithography, is a process used to transfer a sophisticated pattern of a photomask (e.g., template) onto a photoresist coated surface of the substrate (e.g., wafer) using light. Subsequent processing includes etching that creates a permanent pattern of the photomask on the substrate.

In the modern photolithography process, a light source that generates extreme ultraviolet (EUV) light is used for transferring the highly sophisticated pattern onto the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
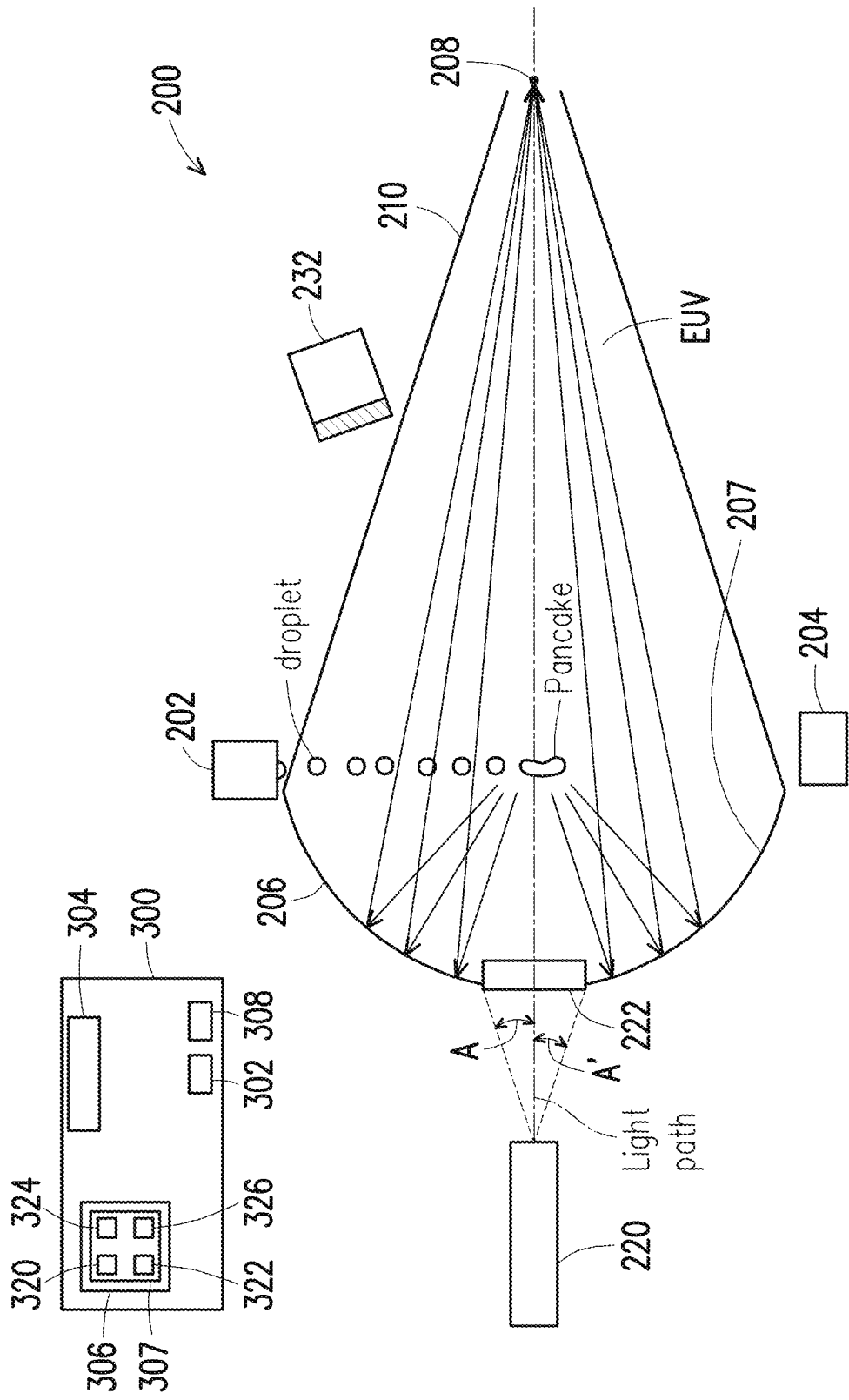
FIG. 1 is a schematic cross-sectional view of a light source in a photolithography equipment according to one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, a photolithography equipment or tool includes a light source, a condenser lens, a photomask, projection lens, and a substrate table. Intense light such as extreme ultraviolet light (EUV light) from the light source travels through the condenser lens, the photomask, and the projection lens. In an exposure step, the light from the light source is directed onto a photoresist coated substrate (e.g., wafer), after passing the condenser lens, the photomask, and the projection lens. By exposing the substrate to the intense light, a sophisticated pattern from the photomask is transferred onto the substrate.

To generate the intense light (e.g., EUV light) that is suitable for transferring the sophisticated pattern of the photomask (e.g., template for <5 nm fabrication process) onto the photoresist coated surface of the substrate (e.g., wafer) consistently, a high energy light (e.g., carbon dioxide laser and excimer laser) is illuminated to a very small droplet (e.g., droplet having 30 μm diameter) that includes tin (Sn) in the source vessel of the light source. Since tin is an efficient generator of the EUV light, the high energy light illuminated to the droplet made of tin causes tin (Sn) excitation. In some embodiments, the droplet includes pure tin (Sn), tin compounds (e.g., $SnBr_4$, $SnBr_2$, and $SnH_4$), tin-alloys (e.g., tin-gallium alloys, tin-indium alloys, and tin-indium-gallium alloys), or combinations thereof.

The tin excitation generates an extremely hot plasma which produces significant amount of the high intensity EUV light (e.g., light having a center wavelength at 13.5 nm). In order to use the EUV light in the subsequent exposure step, the EUV light is collected by a collector (e.g., curved reflective surface with a multi-layer coating) that is configured to reflect the EUV light from the plasma selectively into an intermediate focus point in the source vessel of the light source.

To maximize or increase the amount of the EUV light reflected and focused into the intermediate focus point of the light source, it is beneficial to have the reflective surface of the collector clean from the contaminants, such as tin droplet debris (or fragments) produced during the tin excitation process. To clean or remove the tin debris deposited on the curved reflective surface (hereinafter "collector surface"), a flow of hydrogen gas ($H_2$) is introduced into the source vessel of the light source to etch the tin droplet debris deposited on the collector surface. As a result of a chemical reaction between the hydrogen gas ($H_2$) and the tin (Sn) droplet debris deposited on the collector surface, the hydrogen gas ($H_2$) and the tin (Sn) droplet debris are converted into a volatile tin compound, tin hydride ($SnH_4$). By introducing suitable purge gas (e.g., hydrogen gas and nitrogen gas) into the source vessel, the tin hydride ($SnH_4$) can be removed from the source vessel via a purge outlet. This cleaning process will be called "self-cleaning process" in the present disclosure.

Embodiments in accordance with subject matter described herein include the light source, in the photolithography system, that is able to maintain the intensity of the light (e.g., EUV light) by effectively maintaining the temperature of the collector surface at or below a predetermined temperature (e.g., 50° C. or below). The light source according to one or more embodiments disclosed in the present disclosure is able to keep the temperature of the collector surface below the predetermined temperature. As discussed above, the hot plasma is created from the tin excitation. The hot plasma produced from the tin excitation raises the temperature of the collector surface (e.g., above the predetermined temperature) that creates a higher chance for tin (Sn) of the tin hydride ($SnH_4$) to be freed from the tin hydride ($SnH_4$) and re-deposit on the collector surface. In other words, in accordance with various embodiments of the present disclosure, the temperature of the collector surface of the light source is controlled to reduce overall area of "hot spots" on the collector surface (e.g., area above the predetermined temperature) to maintain the effectiveness of the self-cleaning process.

The light source according to one or more embodiments disclosed in the present disclosure is also able to extend the lifetime of the collector by preventing or reducing deformation on the collector surface caused by thermal stresses induced by changes in temperature of the collector surface caused by exposure to the hot plasma generated by the tin excitation.

FIG. 1 is a schematic cross-sectional view of a light source 200 in a photolithography equipment according to one or more embodiments of the present disclosure.

Referring to FIG. 1, the light source 200 includes a droplet generator 202 for generating droplets (e.g., tin (Sn) droplets) into a source vessel 210, a droplet catcher 204 for collecting unused or unirradiated droplets from the droplet generator 202, a collector 206 shaped to reflect the EUV light generated from tin (Sn) excitation selectively into an intermediate focus point 208, a light generator 220 (e.g., carbon dioxide pulse laser generator and excimer laser generator) for generating pre-pulse light and main pulse light, an aperture 222 (e.g., opening) on the collector 206 that allows the pre-pulse light and the main pulse light to illuminate the droplets in the source vessel 210, a thermal image capture device 232 for gathering thermal image data from the collector 206 (e.g., collector surface 207), and a controller 300 for controlling components of the light source 200 including the droplet generator 202, the droplet catcher 204, and the light generator 220 to maintain or improve the result of the self-cleaning process by decreasing the likelihood of the tin hydride ($SnH_4$) decomposition. As discussed above, by reducing the temperature of the collector surface 207 to a relatively low value (e.g., under the predetermined temperature), the likelihood of decomposition of the tin hydride ($SnH_4$) is also reduced.

In accordance with one or more embodiments of the present disclosure, the controller 300 includes an input circuitry 302, a memory 304, a processor 306, and an output circuitry 308. Controller 300 includes the (computer) processor 306 configured to perform the various functions and operations described herein including receiving input data from various data sources (e.g., thermal image data from a thermal image capture device 232 and temperature data from thermoelectric cooling modules 408 shown in FIG. 7) via the input circuitry 302 and transmitting output data (e.g., droplet generator control signal for the droplet generator 202, light control signal for the light generator 220, and temperature setting signal to proportional—integral—derivative (PID) controller 412 shown in FIG. 7) via the output circuitry 308. Memory 304 stores the thermal image data and temperature data received via the input circuitry 302. Memory 304 may be or include any computer-readable storage medium, including, for example, read-only memory (ROM), random access memory (RAM), flash memory, hard disk drive, optical storage device, magnetic storage device, electrically erasable programmable read-only memory (EEPROM), organic storage media, or the like.

In accordance with various embodiments, the light generator 220 (e.g., carbon dioxide pulse laser generator and excimer laser generator) generates a train of light pulses including pre-pulse light and main pulse light, and the light generated by the light generator 220 illuminates the tin droplet traveling in the source vessel 210 that creates the tin excitation. To increase or maximize the amount of the plasma generated from the tin excitation with the main pulse light, the pre-pulse light illuminates the tin droplet before the tin droplet is illuminated with the main pulse light. The tin droplet irradiated with the pre-pulse light expands its diameter. When the diameter of the expanded tin droplet (hereinafter "pancake") matches with the beam size of the main pulse light and the pancake is substantially overlapped with the beam of the main pulse light in the source vessel 210, there is a higher chance of producing more plasma from the tin excitation with the main pulse light.

As discussed above, the pancake irradiated with the main pulse light in the source vessel 210 creates a hot plasma. The heat generated from the hot plasma shifts the temperature distribution of the collector surface 207 based on the direction of the plasma created from the pancake and the relative position of the plasma relative to the collector surface 207.

As will be discussed below, in some embodiments in the present disclosure, the thermal image data of the collector surface 207 is collected (e.g., captured and recorded) by the thermal image capture device 232, and in accordance with the thermal image data from the thermal image capture device 232, the direction of the plasma relative to the collector surface 207 is determined and adjusted to a determined direction by changing an illuminating timing (e.g., irradiation timing) of the main pulse light and/or an illuminating angle A, A' (e.g., irradiation angle) of the main pulse light to the pancake. In some embodiments in the present disclosure, the thermal image data of the collector surface 207 is collected by the thermal image capture device 232, and in accordance with the thermal image data from the thermal image capture device 232, the direction of the plasma to the collector surface 207 is determined and adjusted to the determined direction by changing a velocity of the tin droplet from the droplet generator 202 and/or a traveling path of the tin droplet released from the droplet generator 202 to form the pancake in a particular shape (e.g., position of the pancake at a particular angle to the main pulse light) that will likely produce the hot plasma in the determined direction to the collector surface 207 when the pancake is irradiated with the main pulse light. In some embodiments, the direction of plasma relative to the collector surface 207 is adjusted by adjusting at least one of the illuminating timing of the main pulse light, the illuminating angle A, A' of the main pulse light to the pancake, the velocity of the tin droplet released from the droplet generator 202, or the traveling path of the tin droplet released from the droplet generator 202.

In accordance with various embodiments, the thermal image capture device 232 (e.g., infrared camera, thermal imaging camera, and thermal imager) is installed at a suitable location for measuring infrared radiation emitted from the collector surface 207 (e.g., a location laterally between the collector surface 207 and the intermediate focus point 208) in the light source 200. In some embodiments, the thermal image capture device 232 is able to collect the thermal image data from the collector surface 207 (i.e., curved reflective surface with a multi-layer coating) by sensing the intensity of the infrared radiation emitted from various areas of the collector surface 207 in real-time. In various embodiments, the thermal image capture device 232 includes one or more infrared sensors that are sensitive to wavelengths from about 1 µm to about 14 µm. Based on the thermal image data collected by the thermal image capture device 232 and the relative orientation of the thermal image capture device 232 and the collector surface 207, the processor 306 of a controller 300 analyzes surface temperature distribution on the collector surface 207 and stores coordinates on the collector surface 207 (e.g., x-y and x-y-z) and corresponding temperatures in the memory 304.

In the present disclosure, one or more infrared sensors are included in the thermal image capture device 232 to collect the thermal image data from the collector surface 207. In some embodiments, the infrared sensor includes one or more charge coupled device (CCD) sensors. In some embodiments, the infrared sensor includes one or more complementary metal oxide semiconductor (CMOS) sensors. In some embodiments, the infrared sensor includes one or more other types of sensors which can withstand the heat from the hot plasma created from the tin excitation and collect the thermal image data from the collector surface 207.

Figure 2A:
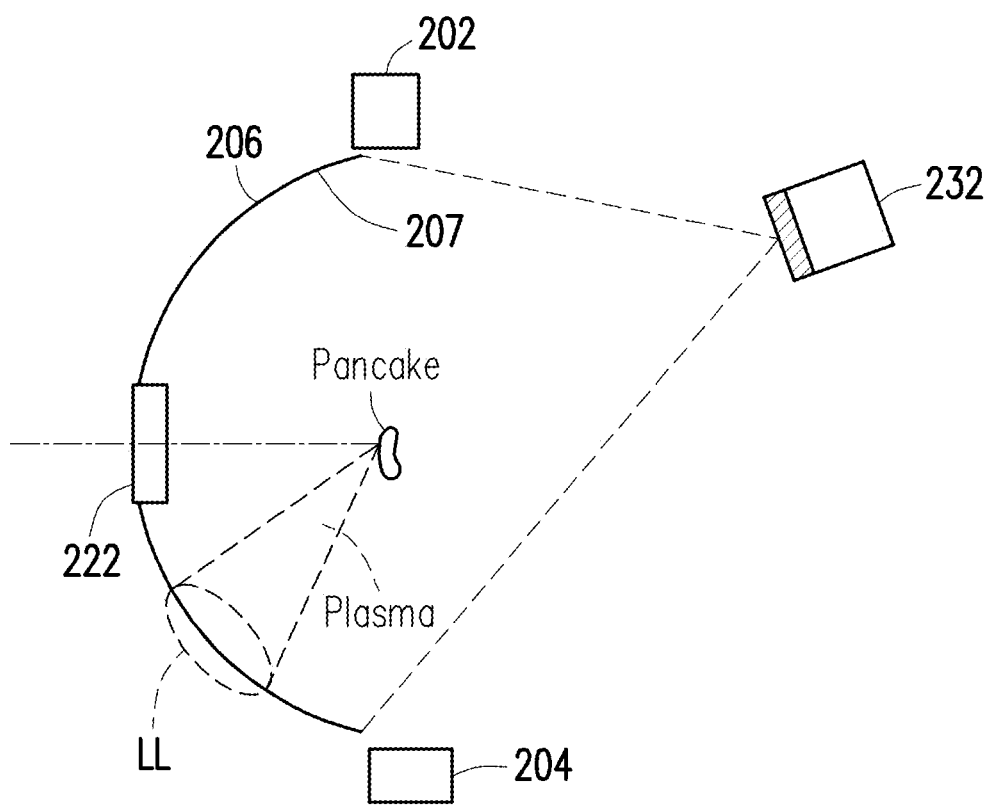
FIG. 2A and FIG. 2B are schematic cross-sectional views of the light source including a thermal image capture device that is being utilized to sense the intensity of infrared radiation emitted from various areas of a collector surface according to one or more embodiments of the present disclosure.

FIG. 2A is a schematic cross-sectional view of the light source 200 including the thermal image capture device 232 that is being utilized to sense the intensity of infrared radiation emitted from various areas of the collector surface 207 according to one or more embodiments of the present disclosure. As illustrated in FIG. 2A, the direction of the plasma from the tin excitation extends toward the lower left area LL of the collector surface 207 due to the shape of the pancake (e.g., position of the pancake at a particular angle to the main pulse light). In accordance with some embodiments, the thermal image capture device 232 senses the intensity of infrared radiation emitted from various locations on the collector surface 207 and transmits the thermal image data based on the sensing result to the processor 306 of the controller 300. In this example, the thermal image data includes thermal data that indicates that the lower left area LL of the collector surface 207 is hotter than other areas of the collector surface 207 due to the direction of the plasma relative to the collector surface 207.

Figure 2B:
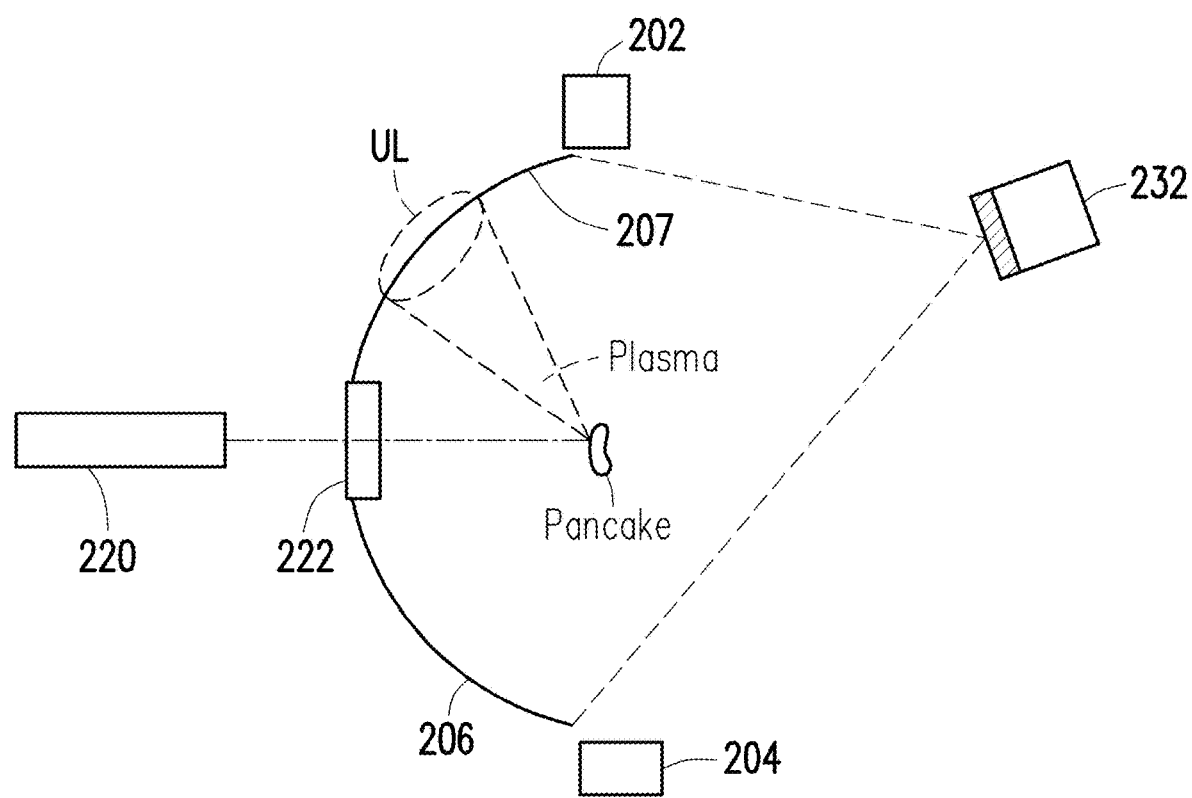

As discussed above, along with other factors, the shape of the pancake (e.g., position of the pancake at a particular angle to the main pulse light) can determine the direction of the plasma. In contrast to the pancake illustrated in FIG. 2A, the pancake illustrated in FIG. 2B has different shape (e.g., position of the pancake at a particular angle to the main pulse light). FIG. 2B is a schematic cross-sectional view of the light source 200 including the thermal image capture device 232 that is being utilized to sense the intensity of infrared radiation emitted from various areas of the collector surface 207 according to one or more embodiments of the present disclosure. As illustrated in FIG. 2B, the direction of the plasma from the tin excitation extends toward the upper left area UL of the collector surface 207 due to the shape of the pancake (e.g., position of the pancake at a particular angle to the main pulse light). In accordance with some embodiments, the thermal image capture device 232 senses the intensity of infrared radiation emitted from various locations on the collector surface 207 and transmits the thermal image data based on the sensing result to the processor 306 of the controller 300. In this example, the thermal image data includes thermal data that indicates that the upper left area UL of the collector surface 207 is hotter than other areas of the collector surface 207 due to the direction of the plasma relative to the collector surface 207.

Figure 3:
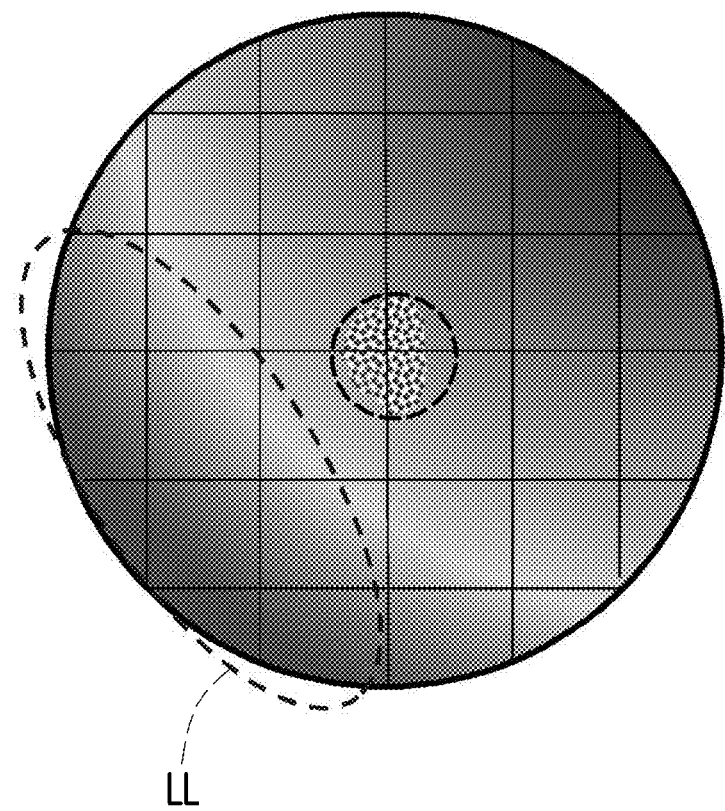
FIG. 3 is a thermal image data collected by the thermal image capture device based on a plasma shown in FIG. 2A.

FIG. 3 is an image of thermal data collected by the thermal image capture device 232 based on the plasma shown in FIG. 2A. The thermal image data illustrates intensity of infrared radiation emitted from various locations on the collector surface 207. Based on the intensity of the infrared radiation (e.g., the intensity of the infrared radiation and the temperature of the corresponding area that emitting the infrared radiation are in a direct proportional relationship within a range of temperatures), the processor 306 analyzes the intensity of the infrared radiation at various locations of the collector surface 207 and stores temperature distribution data that includes coordinates on the collector surface 207 and corresponding temperatures in the memory 304. As illustrated in FIG. 3, the lower left area LL of the collector surface 207 is hotter than other areas of the collector surface 207 since the intensity of infrared radiation at the lower left area LL of the collector surface 207 is higher than the other areas of the collector surface 207.

Referring to FIG. 2A and FIG. 2B, as discussed above, the light source 200 includes the thermal image capture device 232 to collect the thermal image data from the collector surface 207 (i.e., curved reflective surface with a multi-layer coating) in real-time. As illustrated in FIG. 2A and FIG. 2B, the direction of the plasma, created by illuminating the main pulse light to the pancake, extends in various directions based on the shape of the pancake (e.g., position of the pancake at a particular angle to the main pulse light). In non-limiting example, as illustrated in FIG. 2A, due to the pancake facing downwardly with respect to the main pulse light, the direction of the plasma extends toward the lower left area LL of the collector surface 207. In other non-limiting example, as illustrated in FIG. 2B, due to the pancake facing upwardly with respect to the main pulse light, the direction of the plasma extends toward the upper left area UL of the collector surface 207. In some embodiments of the present disclosure, the processor 306 of the controller 300 adjusts the position of the pancake at a particular angle to the main pulse light to control the direction of the plasma. For a non-limiting example, the shape of the pancake can be adjusted to alter the direction of the plasma relative to the collector surface 207. By changing the direction of the plasma relative to the collector surface 207 during regular predetermined intervals, there is less chance of having a hot spot on the collector surface 207 where decomposition of the tin hydride ($SnH_4$) is more likely to occur.

The direction of the plasma relative to the collector surface 207 can be adjusted based on the illuminating timing of the main pulse light and/or the illuminating angle A, A' of the main pulse light to the pancake. As will be described later in the present disclosure, in various embodiments, to prevent the hot spot on the collector surface 207 from the overexposure of the plasma that increases the possibility of the $SnH_4$ decomposition at the hot spot of the collector surface 207, the processor 306 of the controller 300 transmits a light control signal to the light generator 220 to adjust the direction of the plasma or otherwise causes the light generator 220 to adjust the direction of the plasma. In accordance with an embodiment of the present disclosure, based on the thermal image data from the thermal image capture device 232, the processor 306 adjusts the direction of the plasma with the light control signal by adjusting the illuminating timing of the main pulse light and/or the illuminating angle A, A' of the main pulse light to the pancake.

As discussed above, in accordance with various embodiments of the present disclosure, the processor 306 of the controller 300 monitors the temperature of the collector surface 207 and adjusts or controls the temperature of the collector surface 207 to be under the predetermined temperature by adjusting the illuminating angle A, A' of the main pulse light to the expanded droplet (i.e., pancake) based on the temperature distribution data. As a result, for every predetermined interval (e.g., every ten main pulse light irradiations) the direction of the plasma to the collector surface 207 is adjusted to prevent or reduce the occurrence of the hot spot (on the collector surface 207) which can cause the decomposition of the tin hydride ($SnH_4$).

In various embodiments, the controller 300 determines the illuminating angle A, A' of the main pulse light relative to the expanded droplet based on the thermal image data received from the thermal image capture device 232 and main pulse light database stored in the memory 304. In some embodiments, the main pulse light database in the memory 304 includes illuminating angle matching database including the directions of the plasma relative to the collector surface 207 and corresponding illuminating angles of the main pulse light. In some embodiments, the main pulse light database in the memory 304 includes illuminating timing matching database including the directions of the plasma relative to the collector surface 207 and corresponding illuminating timings of the main pulse light. In some embodiments, the main pulse light database in the memory 304 includes a database combining the illuminating angle matching database and the illuminating timing matching database.

In some embodiments, via the input circuitry 302, the processor 306 of the controller 300 receives the thermal image data from the thermal image capture device 232. Based on the thermal image data received and the relative orientation of the thermal image capture device 232 and the collector surface 207, the processor 306 generates the temperature distribution data (e.g., data including coordinates on the collector surface 207 and temperatures at each of the locations) of the collector surface 207. Based on the temperature distribution data, the processor 306 further determines a location of the collector surface 207 that is the coldest among multiple locations of the collector surface 207. Based on the determined location of the collector surface 207, the processor 306 determines the direction of the plasma relative to the collector surface 207 corresponding to the determined location on the collector surface 207. Using the main pulse light database, the processor 306 generates the light control signal (e.g., light control signal that adjusts the illuminating timing of the main pulse light and/or the illuminating angle A, A' of the main pulse light) to the light generator 220 via the output circuitry 308.

In some embodiments, via the input circuitry 302, the processor 306 of the controller 300 receives the thermal image data from the thermal image capture device 232. As discussed above, based on the thermal image data received and the relative orientation of the thermal image capture device 232 and the collector surface 207, the processor 306 generates the temperature distribution data (e.g., data including coordinates on the collector surface 207 and temperatures at each of the locations) of the collector surface 207. Based on the temperature distribution data, the processor 306 determines two or more locations of the collector surface 207 that are below the predetermined temperature and further selects one location among the locations having the temperature below the predetermined temperature. In some embodiments, the processor 306 makes the selection randomly. In some embodiments, the processor 306 makes the selection based on a predetermined order. Based on the selected location of the collector surface 207, the processor 306 determines the direction of the plasma relative to the collector surface 207 corresponding to the selected location on the collector surface 207. Using the main pulse light database, the processor 306 generates the light control signal (e.g., light control signal that adjust the illuminating timing of the main pulse light and/or the illuminating angle A, A' of the main pulse light) to the light generator 220 via the output circuitry 308.

Figure 4:
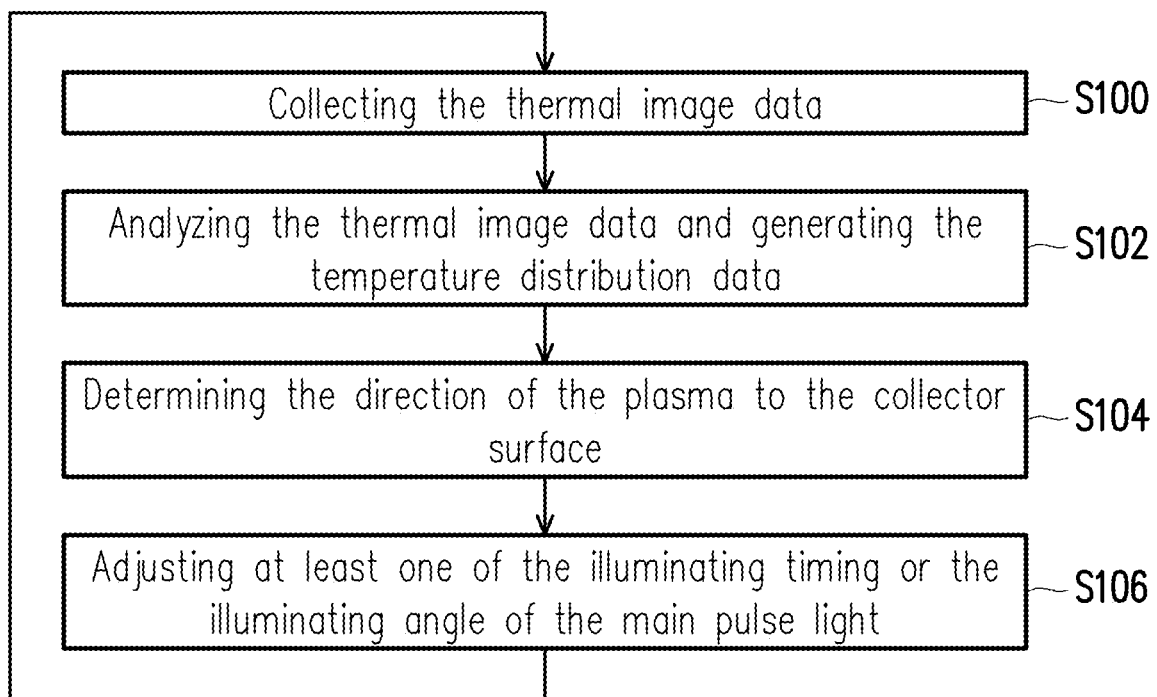
FIG. 4 is a flow chart illustrating a method of adjusting the direction of the plasma to the collector surface to reduce a likelihood of decomposition of tin hydride ($SnH_4$) created during the self-cleaning process according to one or more embodiments of the present disclosure.

FIG. 4 is a flow chart illustrating a method of adjusting the direction of the plasma relative to the collector surface 207 to reduce the chance of decomposition of the tin hydride ($SnH_4$) according to one or more embodiments of the present disclosure.

Referring to FIG. 4, the method of adjusting the direction of the plasma relative to the collector surface 207 to reduce the chance of the decomposition of the tin hydride ($SnH_4$) includes: step S100 of collecting the thermal image data from the collector surface 207; step S102 of analyzing the thermal image data and generating the temperature distribution data; step S104 of determining the direction of the plasma relative to the collector surface 207; and step S106 of adjusting at least one of the illuminating timing of the main pulse light or the illuminating angle A, A' of the main pulse light.

Step S100 of collecting the thermal image data from the collector surface 207 includes a step of capturing a thermal image data of the collector surface 207 using the thermal image capture device 232. As discussed above, the thermal image data of the collector surface 207 captured by the thermal image capture device 232 includes thermal information containing the intensity of infrared radiation emitted from various areas of the collector surface 207 in accordance with one or more embodiments.

Step S102 of analyzing the thermal image data and generating the temperature distribution data includes a step of analyzing the surface temperature distribution on the collector surface 207 based on the thermal image data. The thermal image data illustrates intensity of infrared radiation emitted from various locations on the collector surface 207. Processor 306 analyzes the intensity of the infrared radiation at various locations of the collector surface 207 and determines a corresponding temperature at each of the locations on the collector surface 207. Processor 306 further stores the locations of the collector surface 207 (e.g., x-y and x-y-z) and corresponding temperatures as the temperature distribution data in the memory 304.

Step S104 of determining the direction of the plasma relative to the collector surface 207 includes a step of determining a location on the collector surface 207 that is predicted to maintain its temperature below the predetermined temperature after exposure to the plasma based on the thermal image. In some embodiments, based on the temperature distribution data, the processor 306 determines a location of the collector surface 207 that is the coldest among the locations of the collector surface 207. Based on the determined location of the collector surface 207, the processor 306 determines the direction of the plasma relative to the collector surface 207 corresponding to the determined location on the collector surface 207. In some embodiments, based on the temperature distribution data, the processor 306 determines two or more locations of the collector surface 207 that have temperatures below the predetermined temperature and further selects one location among the locations having the temperatures below the predetermined temperature. In some embodiments, the processor 306 makes the selection randomly. In some embodiments, the processor 306 makes the selection based on a predetermined order. Based on the selected location of the collector surface 207, the processor 306 determines the direction of the plasma relative to the collector surface 207 corresponding to the selected location on the collector surface 207. In some embodiments, based on the temperature distribution data and a collector surface temperature database (stored in the memory 304) that includes temperature history of the collector surface 207, at various locations, before and after the plasma exposure, the processor 306 determines the location on the collector surface 207 that is predicted to maintain its temperature below the predetermined temperature after exposure to the plasma. In some embodiments, the processor 306 utilizes one or more artificial intelligence techniques (which will be explain later in the present disclosure) to determine the location. Based on the determined location of the collector surface 207, the processor 306 determines the direction of the plasma relative to the collector surface 207 corresponding to the determined location on the collector surface 207.

Step S106 of adjusting at least one of the illuminating timing of the main pulse light or the illuminating angle A, A' of the main pulse light includes a step of adjusting at least one of the illuminating timing of the main pulse light or the illuminating angle A, A' of the main pulse light so that the plasma created from the pancake is extended to the determined location of the collector surface 207.

In some embodiments, the above steps 100-106 are repeated to alternate the direction of the plasma (if necessary) for every irradiation of the main pulse light. In some embodiments, the above steps 100-106 are repeated to alternate the direction of the plasma for the predetermined interval (e.g., every ten main pulse light irradiations).

Referring back to FIGS. 2A, 2B, and 3, the light generator 220 generates the pre-pulse light (e.g., one or more pre-pulse light) to expand the diameter of the droplet (e.g., tin droplet) and the main pulse light for generating the hot plasma from the expanded droplet in the source vessel 210. The expanded droplet (i.e., pancake) that is irradiated with the main pulse light in the source vessel 210 creates the hot plasma, which produces the high intense EUV light. The direction of the plasma to the collector surface 207 can be adjusted based on the shape of the pancake (e.g., position of the pancake at a particular angle to the main pulse light). In some embodiments, the velocity of the droplet from the droplet generator 202 is adjusted to change the shape of the pancake. In some embodiments, the traveling path of the droplet is adjusted to change the shape of the pancake. In some embodiments, both the velocity of the droplet and the direction of droplet is adjusted to change the shape of the pancake.

Figure 5:
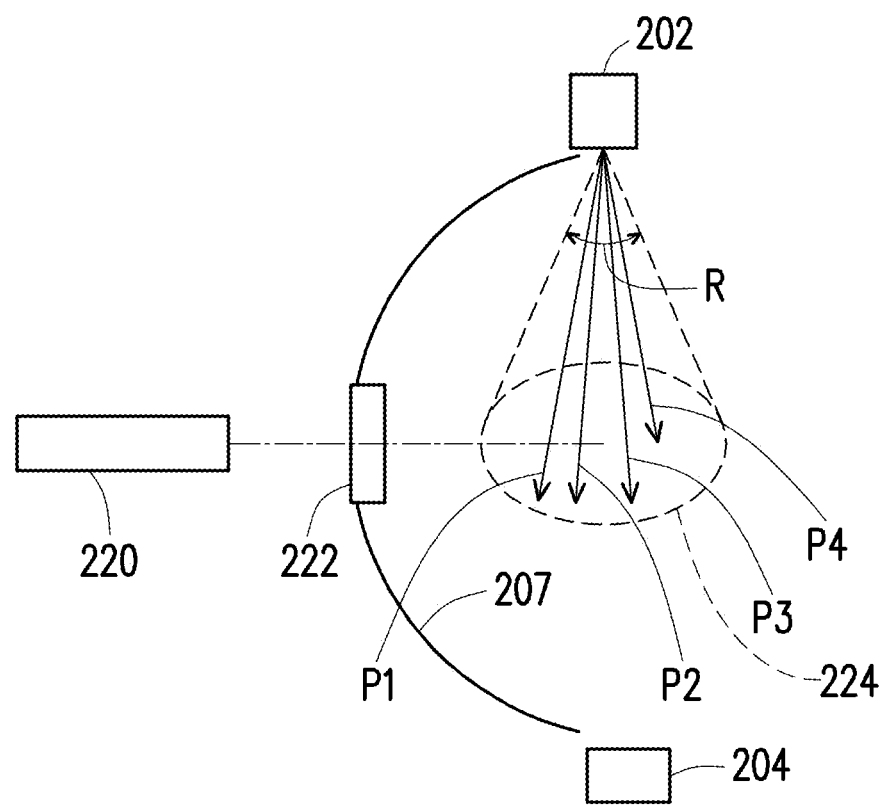
FIG. 5 is a schematic cross-sectional view of the light source including a droplet generator and a droplet catcher according to one or more embodiments of the present disclosure.

FIG. 5 is a schematic cross-sectional view of a light source 200 including the droplet generator 202 and the droplet catcher 204 according to one or more embodiments of the present disclosure.

In accordance with one or more embodiments, the light source 200 includes the droplet generator 202 that is able to adjust the traveling path of the droplet as illustrated in FIG. 5. As shown with some of possible traveling paths P1, P2, P3, and P4 within a traveling path range R, the droplet's traveling path to the irradiation area 224 determines the illuminating angle of the pre-pulse light to the droplet.

In some embodiments, the light source 200 includes the droplet generator 202 that is able to adjust the velocity of the droplet that travels across the source vessel 210. In a non-limiting example, the velocity of the droplet is about 100 miles per hour. The velocity of the droplet determines the illuminating angle of the pre-pulse light to the droplet.

As discussed above, the traveling path of the droplet and the velocity of the droplet can be used to adjust the shape of the pancake (e.g., position of the pancake at a particular angle to the main pulse light) formed from the droplet when the droplet is irradiated with the pre-pulse light. Also, the shape of the pancake determines the direction of the plasma when the pancake is irradiated with the main pulse light as illustrated in FIG. 2A and FIG. 2B.

In various embodiments, the processor 306 of the controller 300 determines the velocity of the droplet and/or the traveling path of the droplet based on the thermal image data received from the thermal image capture device 232 and pre-pulse light database stored in the memory 304. In some embodiments, the pre-pulse light database in the memory 304 includes a velocity matching database including various velocities of the tin droplet, corresponding shapes of the pancake, and corresponding directions of the plasma relative to the collector surface 207. In some embodiments, the pre-pulse light database in the memory 304 includes a droplet traveling path matching database including various traveling paths of the tin droplet, corresponding shapes of the pancake, and corresponding directions of the plasma relative to the collector surface 207. In some embodiments, the pre-pulse light database in the memory 304 includes a database combining the droplet traveling path matching database and the velocity matching database.

In some embodiments, via the input circuitry 302, the processor 306 of the controller 300 receives the thermal image data from the thermal image capture device 232. Based on the thermal image data received and the relative orientation of the thermal image capture device 232 and the collector surface 207, the processor 306 generates the temperature distribution data (e.g., data including coordinates on the collector surface 207 and temperatures at each of the locations) of the collector surface 207. Based on the temperature distribution data, the processor 306 further determines a location of the collector surface 207 that is the coldest among the locations of the collector surface 207. Based on the determined location of the collector surface 207, the processor 306 determines the direction of the plasma relative to the collector surface 207 corresponding to the determined location on the collector surface 207. Using the pre-pulse light database, the processor 306 generates the droplet generator control signal (e.g., droplet generator control signal that adjusts the velocity of the droplet and/or traveling path of the droplet) to the droplet generator 202 via the output circuitry 308.

In some embodiments, via the input circuitry 302, the processor 306 of the controller 300 receives the thermal image data from the thermal image capture device 232. As discussed above, based on the thermal image data received and the relative orientation of the thermal image capture device 232 and the collector surface 207, the processor 306 generates the temperature distribution data (e.g., data including coordinates on the collector surface 207 and temperatures at each of the locations) of the collector surface 207. Based on the temperature distribution data, the processor 306 determines two or more locations of the collector surface 207 that are below the predetermined temperature and further selects one location among the locations having the temperature below the predetermined temperature. In some embodiments, the processor 306 makes the selection randomly. In some embodiments, the processor 306 makes the selection based on a predetermined order. Based on the selected location of the collector surface 207, the processor 306 determines the impinging direction of the plasma to the collector surface 207 corresponding to the selected location on the collector surface 207. Using the pre-pulse light database, the processor 306 generates the droplet generator control signal (e.g., droplet generator control signal that adjusts the velocity of the droplet and/or traveling path of the droplet) to the droplet generator 202 via the output circuitry 308.

Figure 6:
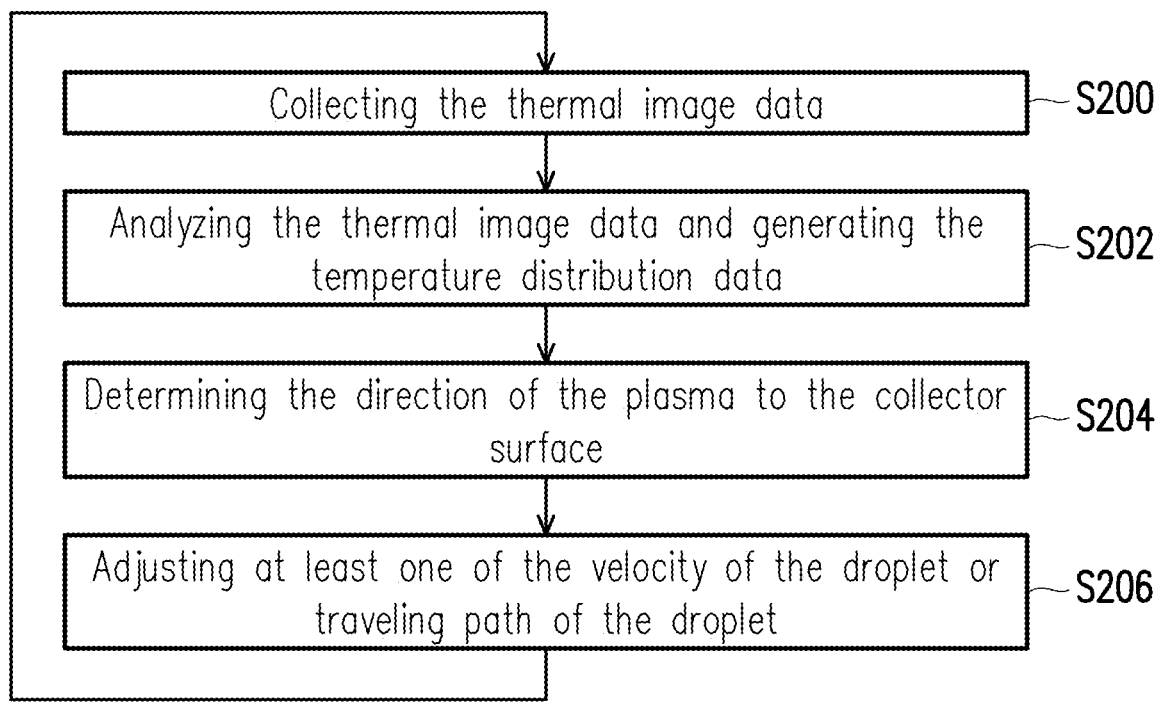
FIG. 6 is a flow chart illustrating a method of adjusting the direction of the plasma to the collector surface to reduce a likelihood of decomposition of tin hydride ($SnH_4$) created during the self-cleaning process according to one or more embodiments of the present disclosure.

FIG. 6 is a flow chart illustrating a method of adjusting the direction of the plasma to the collector surface 207 to reduce the chance of the decomposition of the tin hydride ($SnH_4$) created during the self-cleaning process according to one or more embodiments of the present disclosure.

Referring to FIG. 6, the method of adjusting the direction of the plasma relative to the collector surface 207 to reduce the chance of the decomposition of the tin hydride ($SnH_4$) created during the self-cleaning process includes: step S200 of collecting the thermal image data from the collector surface 207; step S202 of analyzing the thermal image data and generating the temperature distribution data; step S204 of determining the direction of the plasma relative to the collector surface 207; and step S206 of adjusting at least one of the velocity of the droplet or traveling path of the droplet.

Step S200 of collecting the thermal image data from the collector surface 207 includes a step of capturing a thermal image data of the collector surface 207 using the thermal image capture device 232. As discussed above, the thermal image data of the collector surface 207 captured by the thermal image capture device 232 includes thermal information containing the intensity of infrared radiation emitted from various areas of the collector surface 207 in accordance with one or more embodiments.

Step S202 of analyzing the thermal image data and generating the temperature distribution data includes a step of analyzing the surface temperature distribution on the collector surface 207 based on the thermal image data. The thermal image data illustrates intensity of infrared radiation emitted from various locations on the collector surface 207. Processor 306 analyzes the intensity of the infrared radiation at various locations of the collector surface 207 and determines a corresponding temperature at each of the locations on the collector surface 207. Processor 306 further stores the locations of the collector surface 207 (e.g., x-y and x-y-z) and corresponding temperatures as the temperature distribution data in the memory 304.

Step S204 of determining the direction of the plasma to the collector surface 207 includes a step of determining a location on the collector surface 207 that is predicted to maintain its temperature below the predetermined temperature after exposure to the plasma based on the thermal image. In some embodiments, based on the temperature distribution data, the processor 306 determines a location of the collector surface 207 that is the coldest among the locations of the collector surface 207. Based on the determined location of the collector surface 207, the processor 306 determines the direction of the plasma relative to the collector surface 207 corresponding to the determined location on the collector surface 207. In some embodiments, based on the temperature distribution data, the processor 306 determines two or more locations of the collector surface 207 that have temperatures below the predetermined temperature and further selects one location among the locations having the temperature below the predetermined temperature. In some embodiments, the processor 306 makes the selection randomly. In some embodiments, the processor 306 makes the selection based on a predetermined order. Based on the selected location of the collector surface 207, the processor 306 determines the direction of the plasma relative to the collector surface 207 corresponding to the selected location on the collector surface 207. In some embodiments, based on the temperature distribution data and the collector surface temperature database (stored in the memory 304) that includes temperature history of the collector surface 207, at various locations, before and after the plasma exposure, the processor 306 determines the location on the collector surface 207 that is predicted to maintain its temperature below the predetermined temperature after exposure to the plasma. In some embodiments, the processor 306 utilizes one or more artificial intelligence techniques (which will be explain later in the present disclosure) to determine the location. Based on the determined location of the collector surface 207, the processor 306 determines the direction of the plasma relative to the collector surface 207 corresponding to the determined location on the collector surface 207.

Step S206 of adjusting at least one of the velocity of the droplet or traveling path of the droplet includes a step of adjusting at least one of the velocity of the droplet or traveling path of the droplet so that the plasma created from the pancake is extended to the determined location of the collector surface 207.

In some embodiments, the above steps 200-206 are repeated to alternate the direction of the plasma (if necessary) for every time the droplet is generated from the droplet generator 202. In some embodiments, the above steps 200-206 are repeated to alternate the direction of the plasma (if necessary) for the predetermined interval (e.g., every ten droplets generated from the droplet generator 202).

Figure 7:
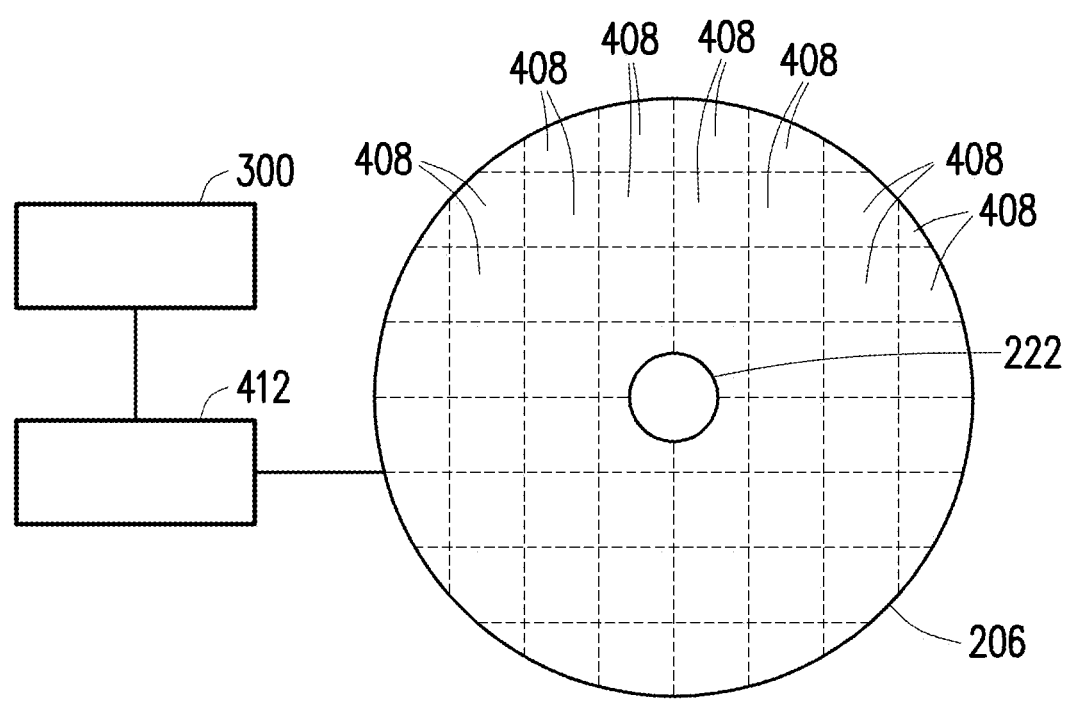
FIG. 7 is a view of thermoelectric cooling modules mounted on a backside of the collector according to one or more embodiments of the present disclosure.
Figure 8:
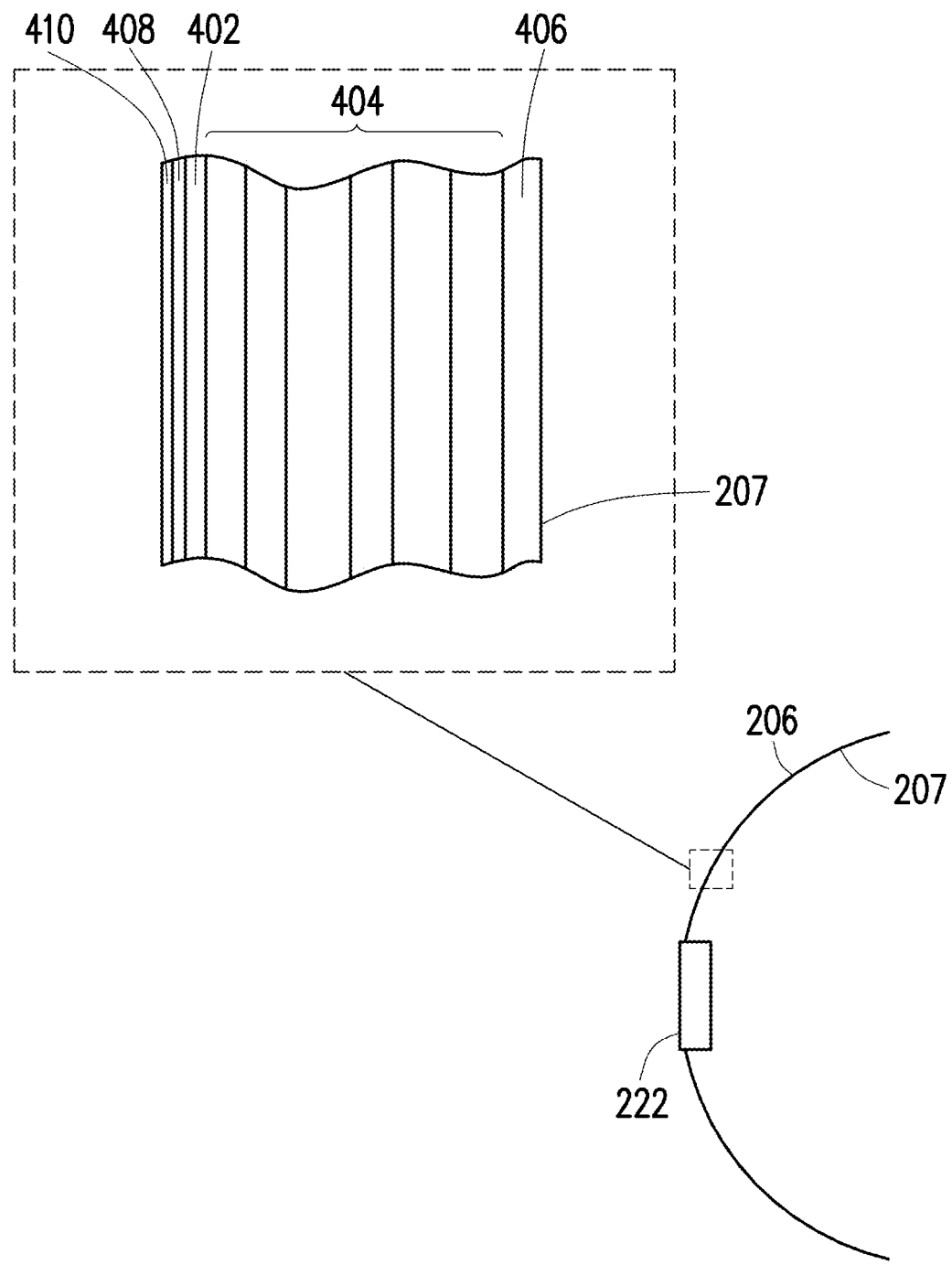
FIG. 8 is a partial cross-sectional view of the collector including a substrate, a reflective layer with multi-layer coating, and the thermoelectric cooling modules according to one or more embodiments of the present disclosure.

FIG. 7 is a view of thermoelectric cooling modules 408 mounted on a backside of the collector 206 (coolant layer 410 not shown) according to one or more embodiments of the present disclosure. FIG. 8 is a partial cross-sectional view of the collector 206 including a substrate 402, a reflective layer with multi-layer coating 404 (e.g., Mo/Si multi-layer coating) on the substrate 402 for reflecting the EUV light to the intermediate focus point 208, a capping layer 406 on the reflective layer 404 for protecting the reflective layer 404 from the plasma, and the thermoelectric cooling modules 408 mounted on the other side of the substrate 402 for absorbing the heat from the capping layer 406 and the reflective layer 404 to a coolant layer 410 according to one or more embodiments.

In accordance with one or more embodiments of the present disclosure, the thermoelectric cooling modules 408 are attached on the backside of the collector 206 to manage the temperature of the collector 206, e.g., cool down the collector 206. In particular, the thermoelectric cooling modules 408 absorb the thermal energy from the reflective layer 404, the capping layer 406, and the substrate 402. Thermoelectric cooling modules 408 further transfer the thermal energy to the coolant layer 410. Eventually, the thermal energy is dissipated by the coolant layer 410. In some embodiments, the coolant layer 410 includes inner channels for coolant fluid circulation. In some embodiments, the coolant layer 410 includes at least one of a heat sink or fin structure. In some embodiments, the coolant layer 410 includes one or more fans to increase the flow of cooling air to the collector 206.

In a non-limiting example, the thermoelectric cooling module 408 includes n-type semiconductor pillars and p-type semiconductor pillars that are alternately arranged in a parallel fashion and configured to transfer heat from one side of the thermoelectric cooling module (i.e., heat absorbing side) to the other side of the thermoelectric cooling module (i.e., heat releasing side). In some embodiments, each of the thermoelectric cooling modules 408 senses the temperature of a respective location of the collector surface 207 and transmits the temperature data to at least one of the controller 300 or a proportional-integral-derivative (PID) controller 412.

Referring to FIGS. 7 and 8, the collector 206 includes the capping layer 406 to protect the reflective layer 404 from the plasma created from the tin excitation, the reflective layer constructed with multilayers of molybdenum /silicon to reflect the high intense EUV light (e.g., light having a center wavelength at 13.5 nm) from the plasma into the intermediate focus point 208, a substrate 402 for supporting the reflective layer 404, and the aperture 222 (e.g., opening) on the collector 206 that allows the pre-pulse light and the main pulse light illuminating on the droplets in the source vessel 210. As illustrated in FIG. 7, when the thermoelectric cooling modules 408 are in operation, e.g., by the Peltier effect, the thermal energy from the collector 206 is absorbed by the heat absorbing side of the thermoelectric cooling modules 408 and transferred to the heat releasing side of the thermoelectric cooling modules 408. As discussed above, the thermal energy transferred from the heat absorbing side to the heat releasing side of the thermoelectric cooling modules 408 is eventually dissipated from the collector 206 via the coolant layer 410 using various cooling methods (e.g., fluid cooling and air cooling). In some embodiments, each of the thermoelectric cooling modules 408 is equipped with a thermal sensor which generates temperature data and transmits the temperature data to one or more devices (e.g., controller 300 and PID controller 412).

In the illustrated embodiment shown in FIG. 7, 60 thermoelectric cooling modules 408 are mounted on the backside of the collector 206 (i.e., opposite side of the collector surface 207). As shown in FIG. 7, each of the thermoelectric cooling modules 408 transmits a heat absorbing side temperature measurement as a feedback signal (i.e., temperature data) to the PID controller 412 and the PID controller 412 compares the temperature measurement with a desired temperature or set temperature (e.g., the predetermined temperature or below the predetermined temperature). If the PID controller 412 determines that the temperature measurement is above the desired temperature, the PID controller 412 transmits ON signal to corresponding thermoelectric cooling modules 408 which transmitted the temperature measurement that is above the predetermined temperature. On other hand, if the PID controller 412 determines that the temperature measurement is at or below the desired temperature, the PID controller 412 transmits OFF signal to corresponding thermoelectric cooling modules 408 which transmitted the temperature measurement that is below the set temperature. In some embodiments, the processor 306 of the controller 300 sets the desired temperature by transmitting a PID control signal to the PID controller 412. In some embodiments, an equipment operator sets the desired temperature on the PID controller 412 directly.

In the illustrated embodiment shown in FIG. 7, the backside of the collector 206 is divided into 60 areas and each of the areas is cooled by one thermoelectric cooling module 408. However, the present disclosure does not limit the total number of the thermoelectric cooling modules 408 mounted on the backside of the collector 206. In some embodiments, more than 60 thermoelectric cooling modules 408 (e.g., >1000 thermoelectric cooling modules 408) are mounted on the backside of the collector 206. In some embodiments, less than 60 thermoelectric cooling modules (e.g., <25 thermoelectric cooling modules 408) are mounted on the backside of the collector 206. In some embodiments, the heat absorbing side of the thermoelectric cooling module 408 has a curvature corresponding to a curvature of the substrate 402. In some embodiments, the heat releasing side of the thermoelectric cooling module 408 has a curvature corresponding to a curvature of the substrate 402. In some embodiments, the thermoelectric cooling modules 408 in various sizes or shapes are mounted on the substrate 402.

Figure 9:
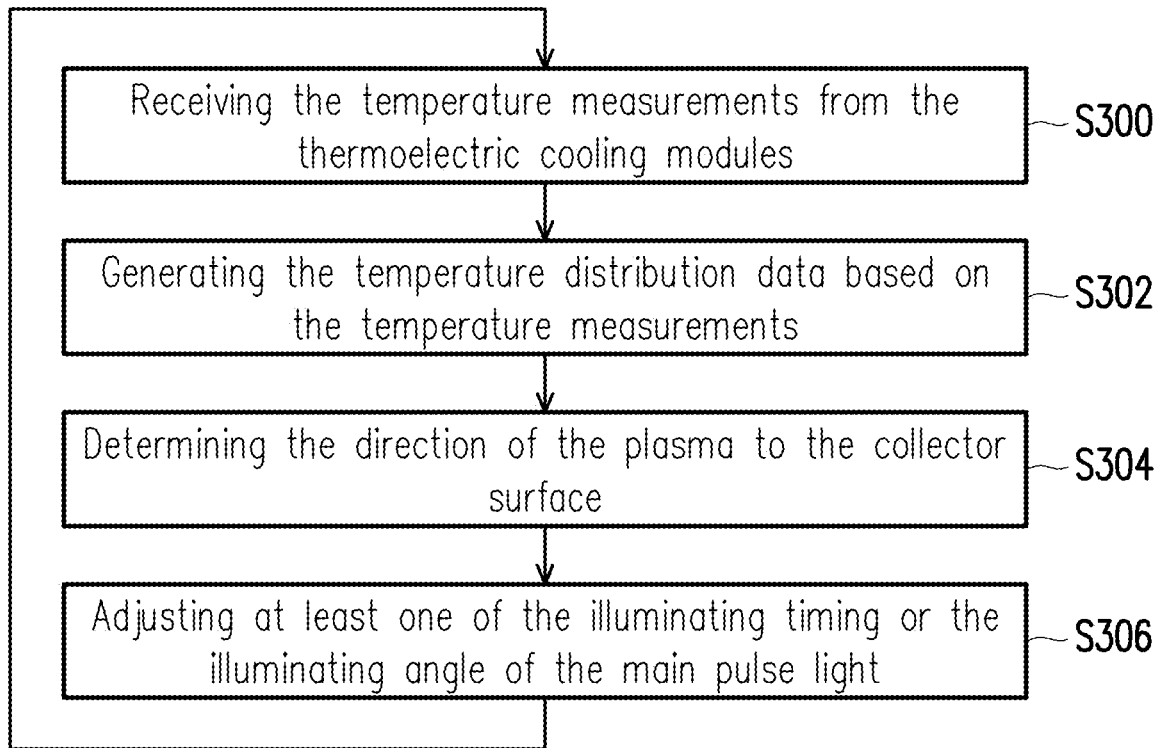
FIG. 9 is a flow chart illustrating a method of adjusting the direction of the plasma to the collector surface to reduce a likelihood of decomposition of tin hydride ($SnH_4$) created during the self-cleaning process according to one or more embodiments of the present disclosure.

The flow chart discussed above in FIG. 4 illustrated that the temperature distribution data, which is used to determine the direction of plasma to the collector surface 207, can be generated based on thermal image data using the thermal image capture device 232. However, the temperature distribution data also can be generated based on the temperature measurements from the thermoelectric cooling modules 408 as shown in FIG. 9. FIG. 9 is a flow chart illustrating a method of adjusting the direction of the plasma relative to the collector surface 207 to reduce the chance of the decomposition of the tin hydride ($SnH_4$) created during the self-cleaning process according to one or more embodiments of the present disclosure. As discussed above, in some embodiments, temperature measurements taken at each of the thermoelectric cooling modules 408 are transmitted to the processor 306 of the controller 300. In some embodiments, the temperature measurements from the thermoelectric cooling modules 408 are used to determine the direction of the plasma. In some embodiments, the temperature measurements from the thermoelectric cooling modules 408 are used to determine the direction of the plasma in conjunction with the temperature distribution data generated based on the thermal image data.

Referring to FIG. 9, the method of adjusting the direction of the plasma to the collector surface 207 to reduce the occurrence of the decomposition of the tin hydride ($SnH_4$) includes: step S300 of receiving the temperature measurements from the thermoelectric cooling modules 408; step S302 of generating the temperature distribution data based on the temperature measurements from the thermoelectric cooling modules 408; step S304 of determining the direction of the plasma relative to the collector surface 207; and step S306 of adjusting at least one of the illuminating timing of the main pulse light or the illuminating angle A, A' of the main pulse light.

Step S300 of receiving the temperature measurements from the thermoelectric cooling modules 408 includes a step of receiving the temperature measurements (i.e., temperature data) from each of the thermoelectric cooling modules 408. In some embodiments, the processor 306 of the controller 300 receives the temperature data directly. In some embodiments, the processor 306 received the temperature data indirectly via the PID controller 412.

Step S302 of generating the temperature distribution data based on the temperature measurements from the thermoelectric cooling modules 408 includes a step of generating the temperature distribution data based on the temperature measurements from the thermoelectric cooling modules 408 (i.e., temperature data). Processor 306 further stores the temperature measurements and corresponding locations of the thermoelectric cooling modules 408 (e.g., x-y and x-y-z) as the temperature distribution data in the memory 304.

Step S304 of determining the direction of the plasma relative to the collector surface 207 includes a step of determining a location on the collector surface 207 that is predicted to maintain its temperature below the predetermined temperature after exposure to the plasma based on the temperature distribution data. In some embodiments, based on the temperature distribution data, the processor 306 determines one thermoelectric cooling module 408 transmitted the coldest temperature measurement among the thermoelectric cooling modules 408 and further determines the location of the collector surface 207 corresponding to the thermoelectric cooling module 408. Based on the determined location of the collector surface 207, the processor 306 determines the direction of the plasma relative to the collector surface 207 corresponding to the determined location on the collector surface 207. In some embodiments, based on the temperature distribution data, the processor 306 determines two or more of the thermoelectric cooling modules 408 that transmitted temperature measurements below the predetermined temperature and further selects one thermoelectric cooling module 408 among the thermoelectric cooling modules 408 that transmitted temperature measurements below the predetermined temperature. In some embodiments, the processor 306 makes the selection randomly. In some embodiments, the processor 306 makes the selection based on a predetermined order. Based on the selected thermoelectric cooling module 408, the processor 306 determines a location of the collector surface 207 corresponding to the selected thermoelectric cooling module 408 and further determines the direction of the plasma relative to the determined collector surface 207. In some embodiments, based on the temperature distribution data and the collector surface temperature database (stored in the memory 304) that includes temperature history of the collector surface 207, at various locations, before and after the plasma exposure, the processor 306 determines the location on the collector surface 207 that is predicted to maintain its temperature below the predetermined temperature after exposure to the plasma. In some embodiments, the processor 306 utilizes one or more artificial intelligence techniques (which will be explain later in the present disclosure) to determine the location. Based on the determined location of the collector surface 207, the processor 306 determines the direction of the plasma relative to the collector surface 207 corresponding to the determined location on the collector surface 207.

Step S306 of adjusting at least one of the illuminating timing of the main pulse light or the illuminating angle A, A' of the main pulse light includes a step of adjusting at least one of the illuminating timing of the main pulse light or the illuminating angle A, A' of the main pulse light so that the plasma created from the pancake is extended to the determined location of the collector surface 207.

In some embodiments, the above steps 300-306 are repeated to alternate the direction of the plasma (if necessary) for every irradiation of the main pulse light. In some embodiments, the above steps 300-306 are repeated to alternate the direction of the plasma for the predetermined interval (e.g., every ten main pulse light irradiations).

Figure 10:
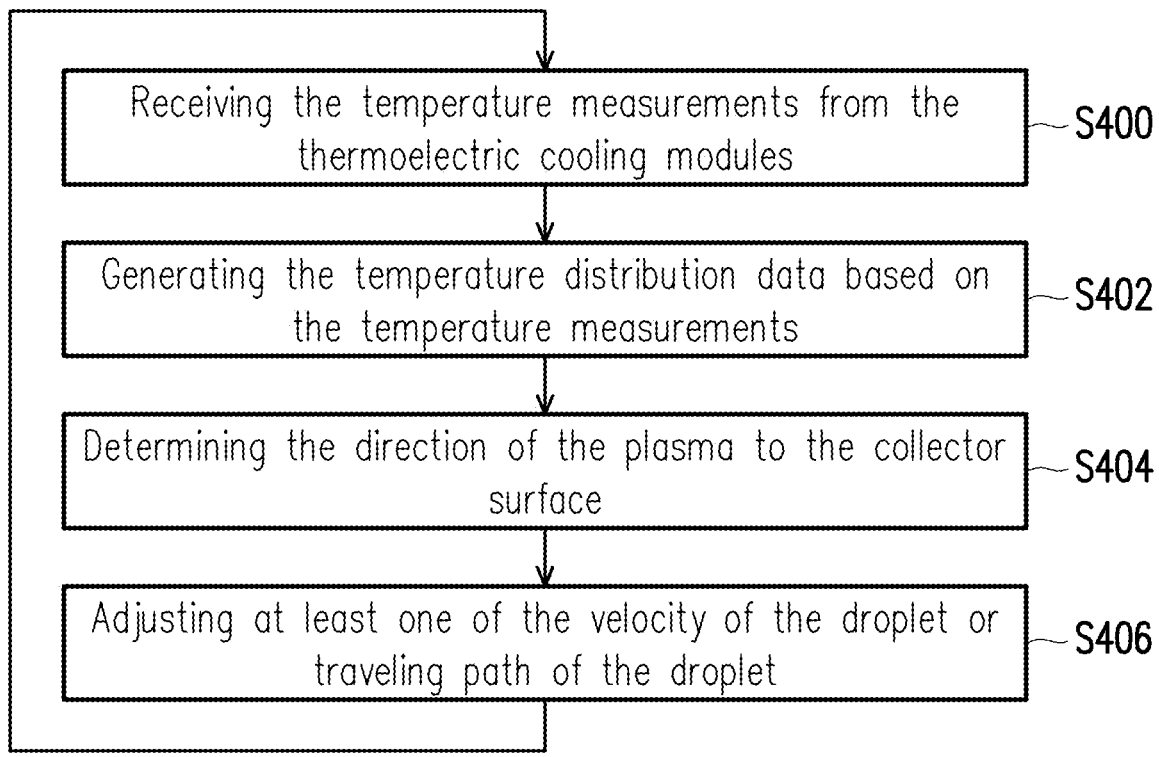
FIG. 10 is a flow chart illustrating a method of adjusting the direction of the plasma to the collector surface to reduce the occurrence of the decomposition of the tin hydride ($SnH_4$) created during the self-cleaning process according to one or more embodiments of the present disclosure.

The flow chart discussed above in FIG. 6 illustrated that the temperature distribution data, which is used to determine the direction of plasma to the collector surface 207, can be generated based on thermal image data using the thermal image capture device 232. However, the temperature distribution data also can be generated based on the temperature measurements from the thermoelectric cooling modules 408 as shown in FIG. 10. FIG. 10 is a flow chart illustrating a method of adjusting the direction of the plasma to the collector surface 207 to reduce the occurrence of the decomposition of the tin hydride ($SnH_4$) according to one or more embodiments of the present disclosure. As discussed above, in some embodiments, temperature measurements taken at each of the thermoelectric cooling modules 408 are transmitted to the processor 306 of the controller 300. In some embodiments, the temperature measurements from the thermoelectric cooling modules 408 are used to determine the direction of the plasma. In some embodiments, the temperature measurements from the thermoelectric cooling modules 408 are used to determine the direction of the plasma in conjunction with the temperature distribution data generated based on the thermal image data.

Referring to FIG. 10, the method of adjusting the direction of the plasma to the collector surface 207 to reduce the occurrence of the decomposition of the tin hydride ($SnH_4$) includes: step S400 of receiving the temperature measurements from the thermoelectric cooling modules 408; step S402 of generating the temperature distribution data based on the temperature measurements from the thermoelectric cooling modules 408; step S404 of determining the direction of the plasma to the collector surface 207; and step S406 of adjusting at least one of the velocity of the droplet or traveling path of the droplet.

Step S400 of receiving the temperature measurements from the thermoelectric cooling modules 408 includes a step of receiving the temperature measurements (i.e., temperature data) from each of the thermoelectric cooling modules 408. In some embodiments, the processor 306 of the controller 300 receives the temperature data directly. In some embodiments, the processor 306 received the temperature data indirectly via the PID controller 412.

Step S402 of generating the temperature distribution data based on the temperature measurements from the thermoelectric cooling modules 408 includes a step of generating the temperature distribution data based on the temperature measurements from the thermoelectric cooling modules 408 (i.e., temperature data). Processor 306 further stores the temperature measurements and corresponding locations of the thermoelectric cooling modules 408 (e.g., x-y and x-y-z) as the temperature distribution data in the memory 304.

Step S404 of determining the direction of the plasma relative to the collector surface 207 includes a step of determining a location on the collector surface 207 that is predicted to maintain its temperature below the predetermined temperature after exposure to the plasma based on the temperature distribution data. In some embodiments, based on the temperature distribution data, the processor 306 determines one thermoelectric cooling module 408 transmitted the coldest temperature measurement among the thermoelectric cooling modules 408 and further determines the location of the collector surface 207 corresponding to the thermoelectric cooling module 408. Based on the determined location of the collector surface 207, the processor 306 determines the direction of the plasma relative to the collector surface 207 corresponding to the determined location on the collector surface 207. In some embodiments, based on the temperature distribution data, the processor 306 determines two or more of the thermoelectric cooling modules 408 that transmitted temperature measurements below the predetermined temperature and further selects one thermoelectric cooling module 408 among the thermoelectric cooling modules 408 that transmitted temperature measurements below the predetermined temperature. In some embodiments, the processor 306 makes the selection randomly. In some embodiments, the processor 306 makes the selection based on a predetermined order. Based on the selected thermoelectric cooling module 408, the processor 306 determines a location of the collector surface 207 corresponding to the selected thermoelectric cooling module 408 and further determines the direction of the plasma relative to the determined collector surface 207. In some embodiments, based on the temperature distribution data and the prior collector surface temperature data (stored in the memory 304) that includes temperature history of the collector surface 207, at various locations, before and after the plasma exposure, the processor 306 determines the location on the collector surface 207 that is predicted to maintain its temperature below the predetermined temperature after exposure to the plasma. In some embodiments, the processor 306 utilizes one or more artificial intelligence techniques (which will be explain later in the present disclosure) to determine the location. Based on the determined location of the collector surface 207, the processor 306 determines the direction of the plasma relative to the collector surface 207 corresponding to the determined location on the collector surface 207.

Step S406 of adjusting at least one of the velocity of the droplet or traveling path of the droplet includes a step of adjusting at least one of the velocity of the droplet or traveling path of the droplet so that the plasma created from the pancake is extended to the determined location of the collector surface 207.

In some embodiments, the above steps 400-406 are repeated to alternate the direction of the plasma (if necessary) for every time the droplet is generated from the droplet generator 202. In some embodiments, the above steps 200-206 are repeated to alternate the direction of the plasma (if necessary) for the predetermined interval (e.g., every ten droplets generated from the droplet generator 202).

In accordance with various embodiments of the present disclosure, the light source 200 is also able to reduce the size of the hot spot on the collector surface 207 that causes the decomposition of the tin hydride ($SnH_4$) and extends the lifetime of the collector by preventing the occurrence of deformation on the collector surface caused by the thermal stresses from the hot plasma generated by the tin excitation.

Figure 11:
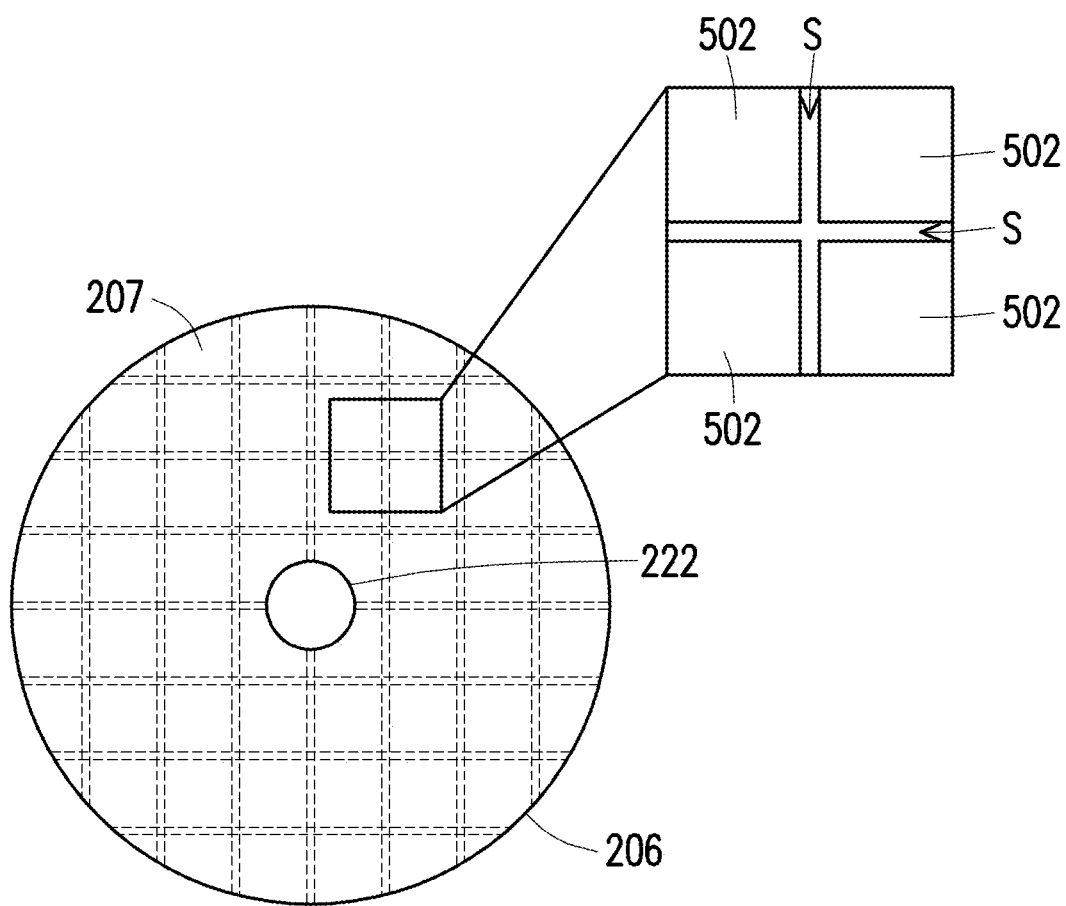
FIG. 11 is a view of a frontside of a collector that is divided into multiple individual reflective surfaces that are spaced apart from each other according to one or more embodiments of the present disclosure.
Figure 12:
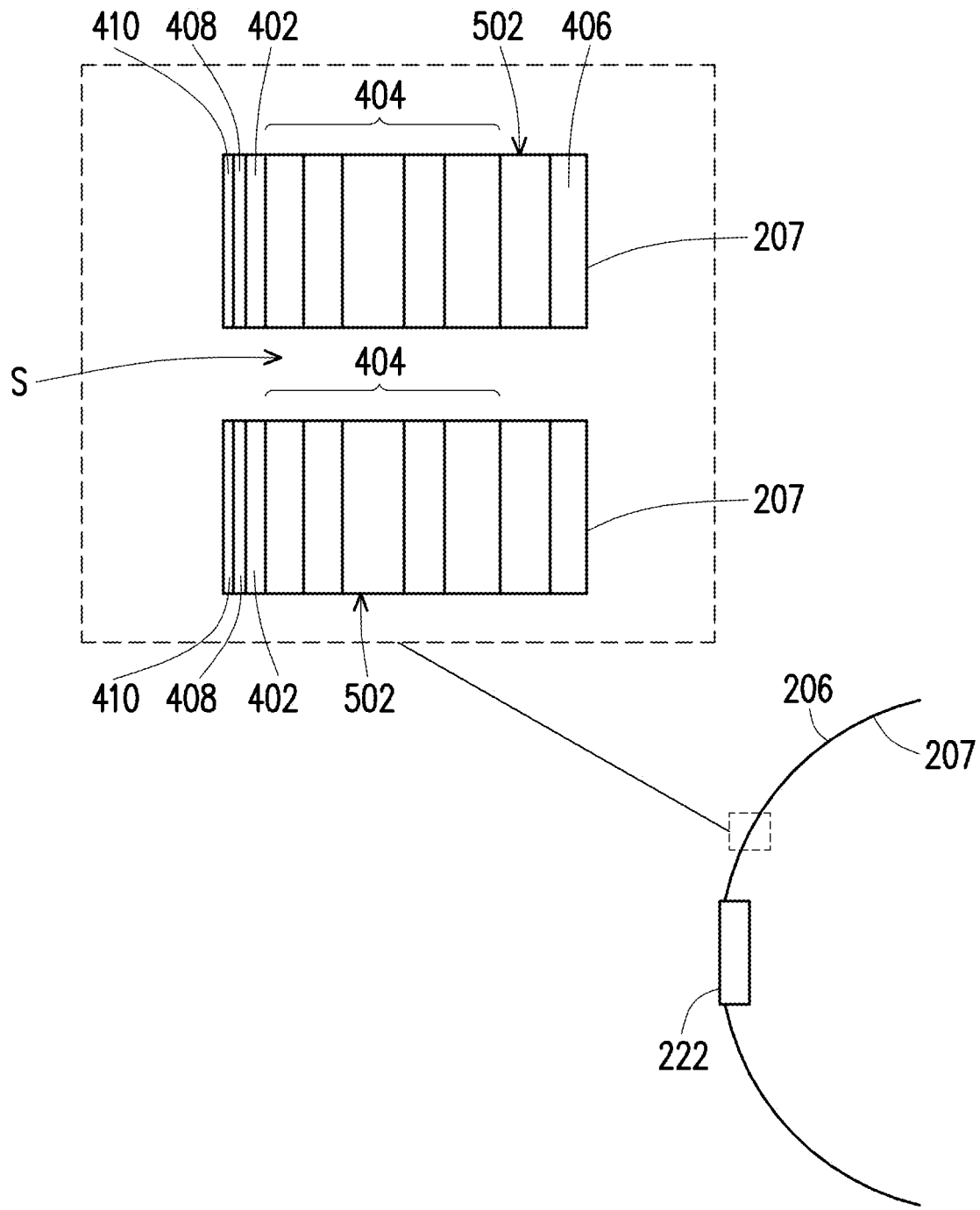
FIG. 12 is a partial cross-sectional view of a collector including individual reflective surfaces 502 according to one or more embodiments of the present disclosure.

FIG. 11 is a view of a frontside of the collector 206 (i.e., collector surface 207) that is divided into multiple individual reflective surfaces 502 that are spaced apart from each other according to one or more embodiments of the present disclosure. FIG. 12 is a partial cross-sectional view of the collector 206 including the individual reflective surfaces 502 according to one or more embodiments of the present disclosure. As illustrated in FIGS. 11 and 12, each of the individual reflective surfaces 502 is isolated from each other thermally with the spacing S that divides the substrate 402, the reflective layer with multi-layer coating 404 (e.g., Mo/Si multi-layer coating), and the capping layer 406. In some embodiments, each of the individual reflective surfaces 502 is provided with its own thermoelectric cooling module 408 as shown in FIG. 12. In some embodiments, each of the individual reflective surfaces 502 is provided with its own coolant layer as shown in FIG. 12. In some embodiments, the individual reflective surfaces 502 are divided by the spacing S into various shapes (e.g., diamond, triangle, square, rectangle, octagon, and hexagon). In the embodiment shown in FIG. 11, the collector 206 is divided into multiple square-shaped individual reflective surfaces 502.

Since the collector 206 illustrated in FIG. 11 is construed with multiple individual reflective surfaces 502 that are spaced apart from each other, each of the individual reflective surfaces 502 has space to expand or contract in response to changes in temperature of the multiple reflective surfaces 502. This flexibility reduces thermal induced stress due to temperature changes induced by exposure of the plasma. In other words, the collector 206, constructed with multiple individual reflective surfaces 502, is less likely to deform and more likely to have a longer lifetime due to the spacing S.

As discussed above, it is beneficial to maintain the temperature of the collector surface 207 relatively low (e.g., under the predetermined temperature) to avoid the occurrence of the tin hydride decomposition. As illustrated in FIG. 12, since the individual reflective surfaces 502 are spaced apart from each other, the heat from the plasma applied to one individual reflective surface 502 is less likely to propagate or conduct to other neighboring individual reflective surfaces 502. By reducing the heat propagation between the individual reflective surfaces 502, the heat or thermal energy that can cause the decomposition of tin hydride is more likely to be confined within the individual reflective surfaces 502 and less likely to propagate to surrounding individual reflective surfaces 502.

It is also beneficial to have the individual reflective surfaces 502 spaced apart from each other, since the fabrication operator is able to repair the collector 206 by replacing the individual reflective surfaces 502 that are defective. The cost of fabrication operation is significantly decreased by replacing the defective individual reflective surfaces 502 rather than replacing the whole collector 206.

As discussed above, to clean or remove the tin debris deposited on the collector surface 207, a flow of hydrogen gas ($H_2$) is introduced into the source vessel 210 of the light source to etch the tin droplet debris deposited on the collector surface. As a result of a chemical reaction between the hydrogen gas ($H_2$) and the tin (Sn) droplet debris deposited on the collector surface 207, the hydrogen gas ($H_2$) and the tin (Sn) droplet debris are converted into a volatile tin compound, tin hydride ($SnH_4$). By introducing suitable purge gas (e.g., hydrogen gas or nitrogen gas) into the source vessel, the tin hydride ($SnH_4$) can be removed from the source vessel 210 via a purge outlet.

In accordance with various embodiments of the present disclosure, the purge gas (e.g., hydrogen gas) is introduced into the source vessel 210 via the spacing S. In some embodiments, the purge gas is introduced into the source vessel 210 to purge the volatile tin compound (e.g., tin hydride). In some embodiments, the purge gas is introduced to the source vessel 210 via the spacing S to cool down the collector surface 207. In some embodiments, the purge gas is introduced into the source vessel 210 to create "scrubbing" gas flow in various directions that remove the tin (Sn) droplet debris deposited on the collector surface 207. In some embodiments, the purge gas is introduced into the source vessel 210 to create the "scrubbing" gas flow in various directions that deflect away the tin (Sn) droplet debris from landing on the collector surface 207.

FIGS. 13-16 are partial cross-sectional views of the collector 206 that utilize the spacing S as gas injection channels to introduce the purge gas to clean the collector surface 207 from the tin droplet debris as described above according to one or more embodiments of the present disclosure.

Figure 13:
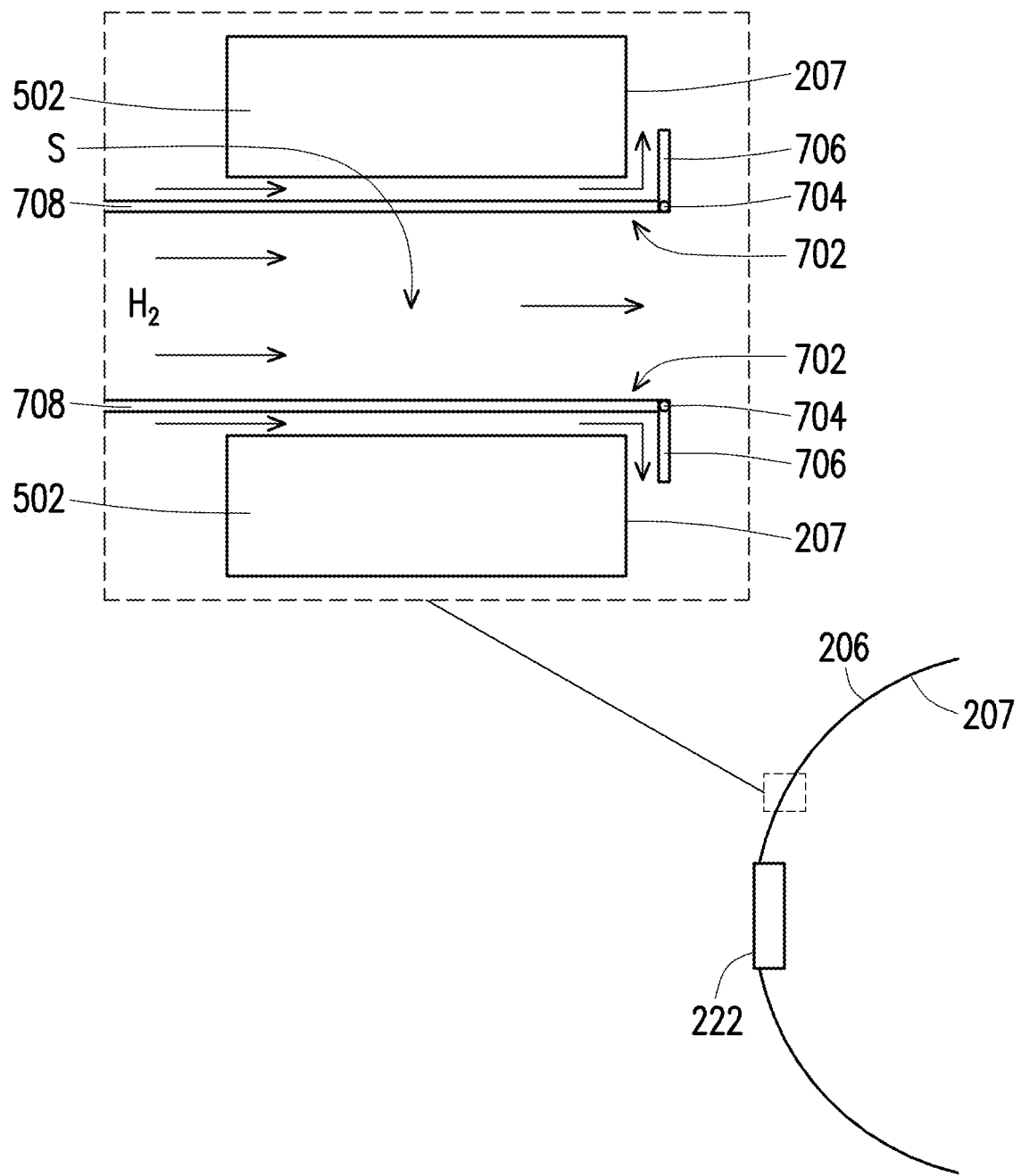
FIGS. 13-16 are partial cross-sectional views of the collector that utilizes the spacing S as gas injection channels to introduce the purge gas to clean the collector surface from the tin droplet debris according to one or more embodiments of the present disclosure.

Referring to FIG. 13, the light source 200 includes the collector 206 arranged with flow guide members 702 to remove the tin (Sn) droplet debris deposited on the collector surface 207 in accordance with some embodiments of the present disclosure. In various embodiments, the flow guide members 702 are arranged in the spacing S.

In the illustrated embodiment shown in FIG. 13, the collector 206 in the light source 200 is construed with multiple individual reflective surfaces 502 that are collectively curved to reflect and focus the EUV light from the plasma into the intermediate focus point 208. As discussed above, each of the individual reflective surfaces 502 is thermally isolated from each other due to the spacing S that surrounds each of the individual reflective surfaces 502.

In the illustrated embodiment shown in FIG. 13, the purge gas is introduced into the source vessel 210 from the backside of the collector 206 via the spacing S arranged between the individual reflective surfaces 502. Due to the vacuum environment in the source vessel 210, the velocity of purge gas flowing into the source vessel 210 increases significantly as the purge gas enters the source vessel 210 via the spacing S. In some embodiments, the flow guide members 702 guide the purge gas to flow in various directions to promote the removal of the tin droplet debris deposited on the collector surface 207 or to deflect away the tin droplet debris from landing on the collector surface 207.

In the illustrated embodiment shown in FIG. 13, the flow of the purge gas is controlled with the flow guide members 702 arranged in parallel between two adjacent individual reflective surfaces 502. In some embodiments, each of the flow guide members 702 includes one or more hinges 704 or flex points to direct or re-direct the flow of the purge gas to various directions (e.g., direct to the collector surface 207 and direct to a space above the collector surface 207). As shown in FIG. 13, each of the flow guide members 702 includes a first guide arm 706, and a second guide arm 708 that is coupled to the first guide arm 706 via the hinge 704.

As illustrated in FIG. 13, the angle between the first guide arm 706 and the second guide arm 708 at the hinge 704 is adjustable. In a non-limiting example, to remove the tin debris deposited on the collector surface 207, the first guide arm 706 and the second guide arm 708 form an angle equal or less than 90 degrees. In non-limiting example, to prevent the tin debris from landing on the collector surface 207, the first guide arm 706 and the second guide arm 708 form an angle more than 90 degrees. In another non-limiting example, the first guide arm 706 changes its position (e.g., flapping) to direct the flow of the purge gas in various directions. In some embodiments, the processor 306 controls the angle between the first guide arm 706 and the second guide arm 708.

In some embodiments, the second guide arm 708 has an elongated rectangular panel shape with a slim thickness in a cross-section perpendicular to the direction of purge gas flow which allows the second guide arm 708 to allow more purge gas to flow from the backside of the collector 206 into the source vessel 210. In some embodiments, the first guide arm 706 is an extension of the second guide arm 708 and is coupled thereto with the hinge 704.

Figure 14:
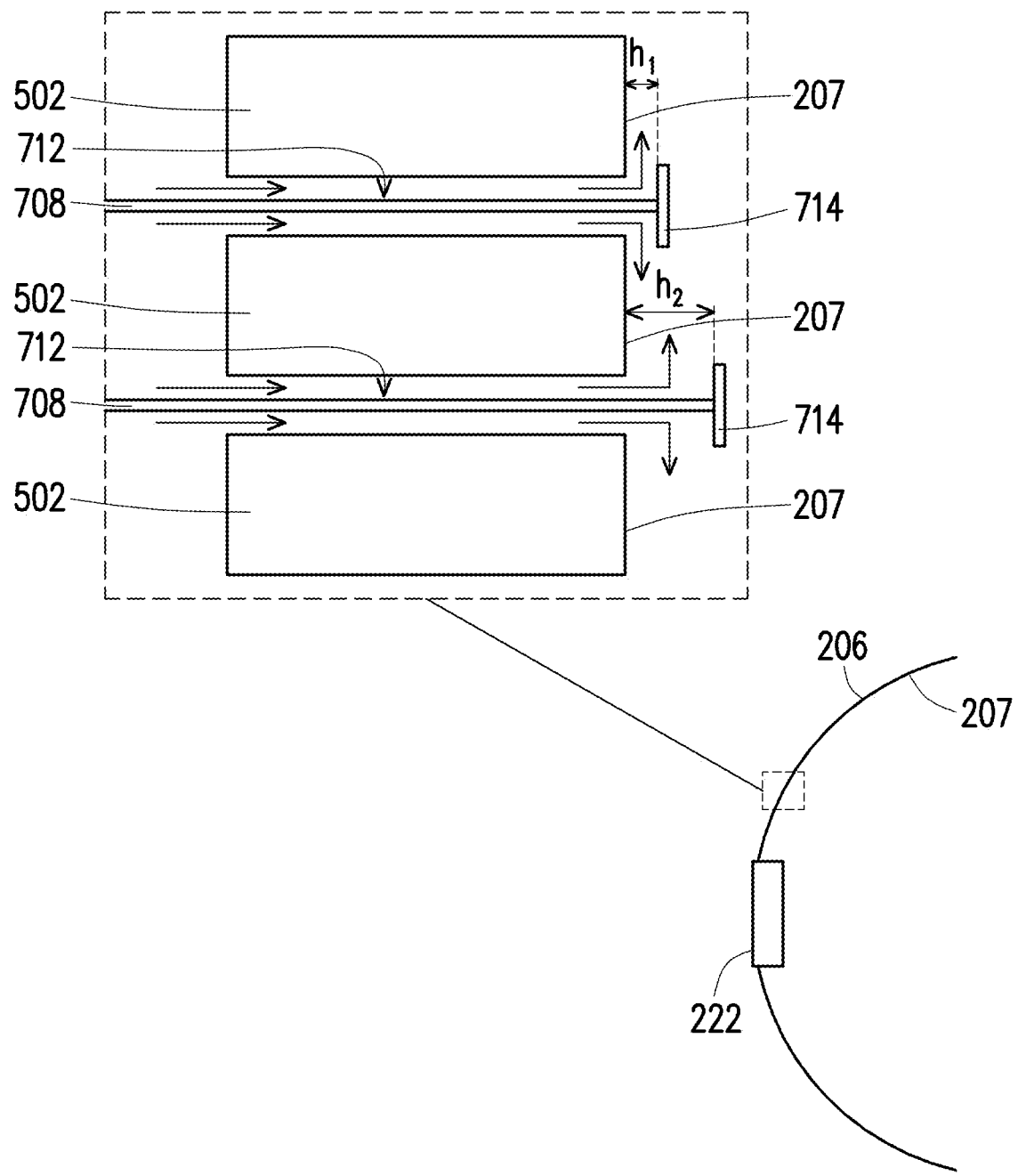

Referring to FIG. 14, the light source 200 includes the collector 206 configured with T-shaped flow guide members 712 which affect the flow of purge gas from the backside of the collector 206 into source vessel 210 to promote removal of the tin (Sn) droplet debris deposited on the collector surface 207 in some embodiments of the present disclosure.

In the illustrated embodiment shown in FIG. 14, the purge gas is directed to the collector surface 207 (shown with h1 in FIG. 14) and surrounding area of the collector surface 207 (shown with h2 in FIG. 14) with the T-shaped flow guide members 712 arranged between the individual reflective surfaces 502.

As shown in FIG. 14, each of the T-shaped flow guide members 712 includes the second guide arm 708 and a dispersion member 714 arranged adjacent to collector surface 207. As shown in FIG. 14, the dispersion member 714 is an extension of the second guide arm 708 in two different directions in some embodiments. In some embodiments, the dispersion member 714 provides a flat surface or substantially flat surface arranged adjacent to the collector surface 207. In some embodiments, the end of the second guide arm 708 is attached to the flat surface. In some embodiments, the end of the second guide arm 708 is attached to the middle portion of the flat surface. In some embodiments, the second guide arm 708 retracts towards the backside of the collector 206 when the purge gas is not introduced to the source vessel 210. In some embodiments, the second guide arm member 708 extends into the source vessel 210 to direct the purge gas to the collector surface 207 for "scrubbing" the tin droplet debris deposited on the collector surface 207 (shown with h1 in FIG. 14). In some embodiments, the second guide arm 708 extends further into the source vessel 210 to direct the purge gas to the surrounding area of the collector surface 207 for preventing the tin droplet debris from landing on the collector surface 207 (shown with h2 in FIG. 14). In some embodiments, the processor 306 determines the length of the second guide arm 708 that extends into the source vessel 210.

Figure 15:
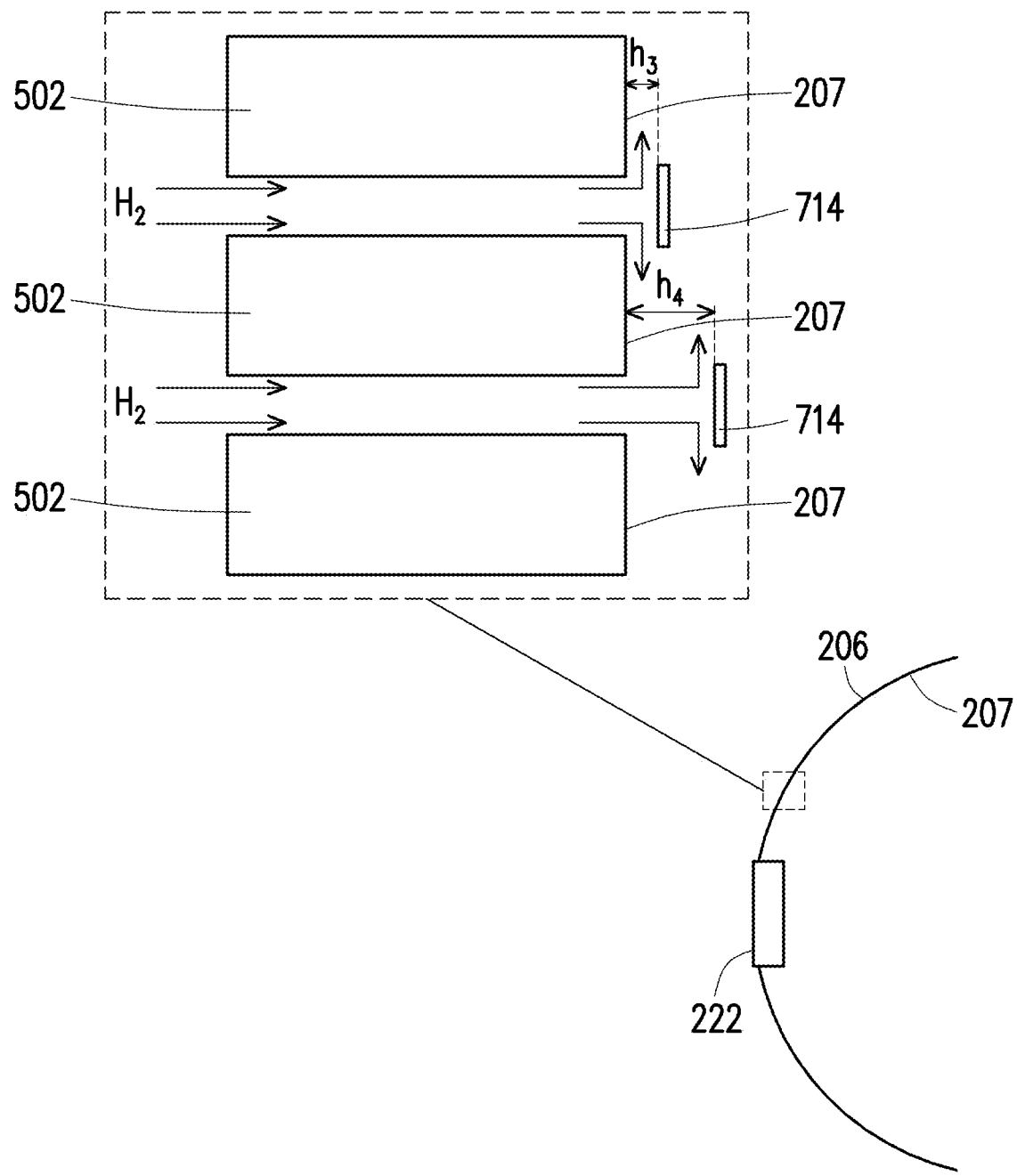

Referring to FIG. 15, the light source 200 includes the collector 206 configured with the dispersion member 714 which affects the flow of purge gas from the backside of the collector 206 into source vessel 210 to promote removal of the tin droplet debris deposited on the collector surface 207 in some embodiments of the present disclosure. In the illustrated embodiment shown in FIG. 15, the dispersion members 714 direct the purge gas toward various directions. In some embodiments, the purge gas is directed by the dispersion member 714 toward the collector surface 207 (shown with h3 in FIG. 15). In some embodiments, the purge gas is directed by the dispersion member 714 toward the surrounding area of the collector surface 207 (shown with h4 in FIG. 15). In some embodiments, the distance between the dispersion member 714 and the collector surface 207 (e.g., h3 and h4 in FIG. 15) is adjustable. In some embodiments, the processor 306 determines the position of the dispersion members 714. In a non-limiting example, the dispersion members 714 are arranged next to each other in one direction (e.g., h3 and h4 are equal). In other non-limiting example, dispersion members 714 are not arranged in one direction as shown in FIG. 15 (e.g., h3 and h4 are not equal).

Figure 16:
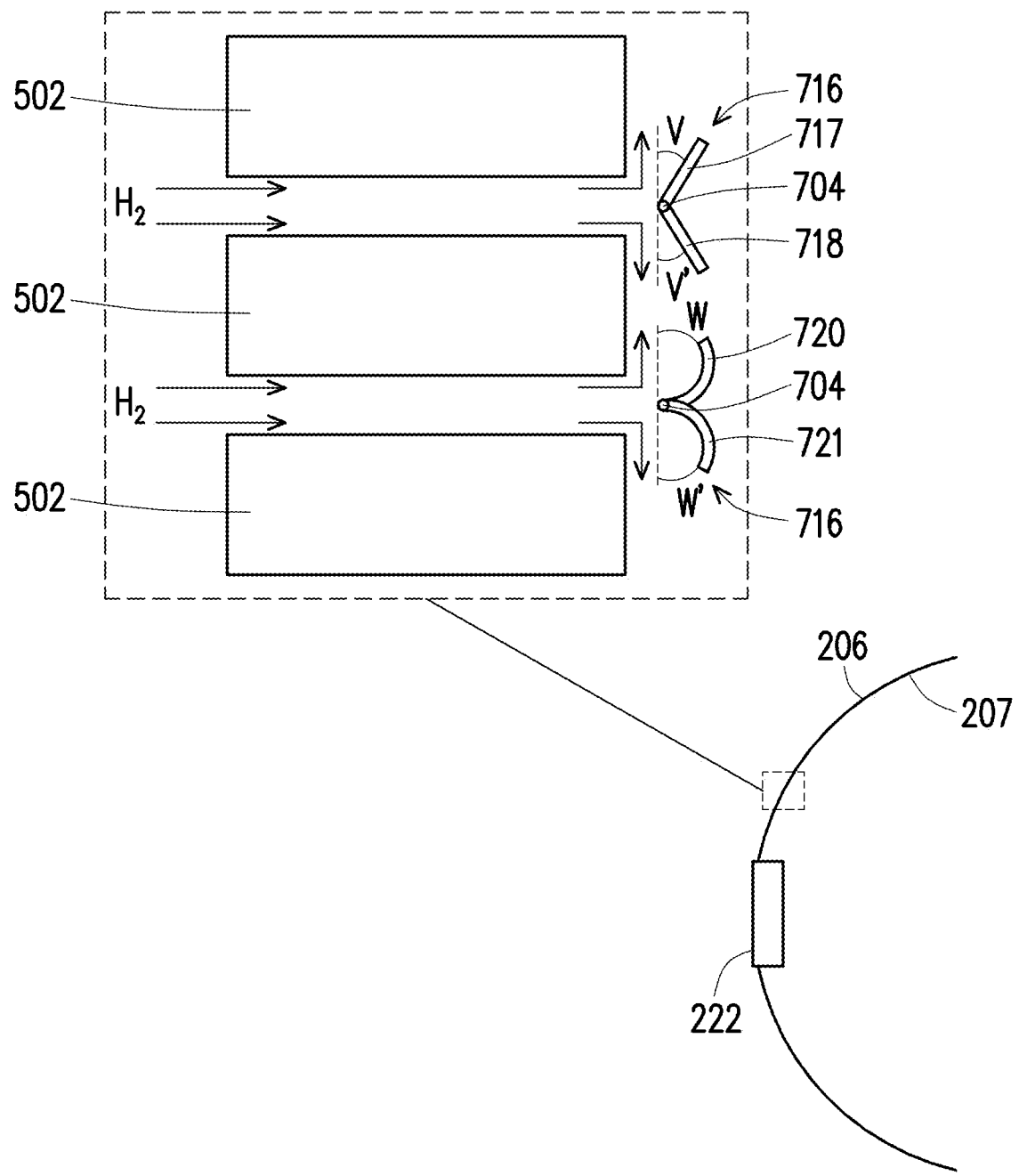

Referring to FIG. 16, the light source 200 includes the collector 206 configured with adjustable dispersion members 716 which affect the flow of purge gas from the backside of the collector 206 into source vessel 210 to promote removal of tin (Sn) droplet debris deposited on the collector surface 207 in some embodiments of the present disclosure.

In the illustrated embodiment shown in FIG. 16, the flowing direction of the purge gas is directed to the collector surface 207 and the surrounding area of the collector surface 207 with the adjustable dispersion members 716.

In some embodiments, the adjustable dispersion member 716 includes a first flat wing member 717 and a second flat wing member 718. The first flat wing member 717 and the second flat wing member 718 are coupled with the hinge 704. In some embodiments, the adjustable dispersion member 716 includes a first curved wing member 720 and a second curved wing member 721. The first curved wing member 720 and the second curved wing member 721 are coupled with the hinge 704. In some embodiments, the angle between the two wing members is adjustable. In a non-limiting example, the angle (e.g., V, V', W and W') is 45 degrees or less to direct majority of the purge gas to the collector surface 207. In a non-limiting example, the angle (e.g., V, V', W and W') is more than 45 degrees to direct majority of the purge gas to the surrounding area of the collector surface 207. In some embodiments, each of the angles (e.g., V, V', W and W') are individually arranged. In some embodiments, the processor 306 determines the angles (e.g., V, V', W and W') to remove the tin droplet debris or cool down the collector surface 207.

Referring to FIG. 1, the light source 200 includes the controller 300 for controlling components of the light source 200 including the droplet generator 202, the droplet catcher 204, and the light generator 220 to maintain or improve the result of the self-cleaning process by decreasing the chance of the tin hydride ($SnH_4$) decomposition.

In some embodiments, the processor 306 includes an artificial intelligence controller 307 that includes a main pulse light controller 320, droplet generation controller 322, thermoelectric cooling module controller 324, and purge gas flow controller 326.

Main pulse light controller 320 is used to determine and/or predict the proper illuminating timing and/or the illuminating angle A, A' of the main pulse light by employing one or more artificial intelligence techniques. Droplet generation controller 322 is used to determine and/or predict the proper velocity of the droplet and/or traveling path of the droplet by employing one or more artificial intelligence techniques. Thermoelectric cooling module controller 324 is used to control operation of the thermoelectric cooling modules 408 by employing one or more artificial intelligence techniques. Purge gas flow controller 326 is used to control operation of directing the flow of the purge gas by employing one or more artificial intelligence techniques.

"Artificial intelligence" is used herein to broadly describe any computationally intelligent systems and methods that can learn knowledge (e.g., based on training data), and use such learned knowledge to adapt their approaches for solving one or more problems, for example, by making inferences based on a received input such as measurements (e.g., thermal image data from a thermal image capture device 232 and temperature data from thermoelectric cooling modules 408) received via the input circuitry 302. Artificially intelligent machines may employ, for example, neural network, deep learning, convolutional neural network, Bayesian program learning, and pattern recognition techniques to solve problems such as determining the illuminating timing of the main pulse light. Further, artificial intelligence may include any one or combination of the following computational techniques: constraint program, fuzzy logic, classification, conventional artificial intelligence, symbolic manipulation, fuzzy set theory, evolutionary computation, cybernetics, data mining, approximate reasoning, derivative-free optimization, decision trees, and/or soft computing. Employing one or more computationally intelligent techniques, the main pulse light controller 320 may learn to determine and/or predict the proper illuminating timing and/or the illuminating angle A, A' of the main pulse light.

In some embodiments, based on the collector surface temperature knowledge (e.g., temperature of the collector surface 207, at various locations, before and after the plasma exposure), the artificial intelligence controller 307 makes correction to the collector surface temperature database stored in the memory 304 to optimize or improve the collector surface temperature database which is used to determine the direction of the plasma. In other words, the artificial intelligence controller 307 continuously modifies its behavior in response to the collector surface temperature database and actual result produced by one or more artificial intelligence techniques and updates the direction of the plasma in the collector surface temperature database.

In some embodiments, based on the collector surface temperature knowledge (e.g., temperature of the collector surface 207, at various locations, before and after the plasma exposure), the thermoelectric cooling module controller 324 and purge gas flow controller 326 make correction to the collector surface temperature database stored in the memory 304 to optimize or improve the collector surface temperature database which is used to control the thermoelectric cooling modules 408 and gas flow to various locations of collector 206 (e.g., the angle between the first guide arm 706 and the second guide arm 708 at the hinge 704 in FIG. 13, the height h1 and height h2 in FIG. 14, the height h3 and height h4 in FIG. 15, the angle v, angle v', angle w, and angle w' in FIG. 16) respectively. In other words, each of the thermoelectric cooling module controller 324 and purge gas flow controller 326 continuously modifies its behavior in response to the collector surface temperature database and actual result produced by one or more artificial intelligence techniques and updates the direction of the plasma in the collector surface temperature database.

In some embodiments, based on the main pulse light irradiation knowledge, the main pulse light controller 320 makes corrections to the main pulse light database stored in the memory 304 to optimize or improve the main pulse light database to a particular environment (e.g., temperature measurements from various locations on the collector surface 207). In other words, the main pulse light controller 320 continuously modifies its behavior in response to the main pulse light database and actual result produced by one or more artificial intelligence techniques and updates the illuminating timing and/or the illuminating angle A, A' of the main pulse light in the main pulse light database.

In some embodiments, based on the droplet generation knowledge, the droplet generation controller 322 makes corrections to the pre-pulse light database stored in the memory 304 to optimize or improve the pre-pulse light database to a particular environment (e.g., temperature measurements from various locations on the collector surface 207). In other words, the droplet generation controller 322 continuously modifies its behavior in response to the pre-pulse light database and actual results produced by one or more artificial intelligence techniques and updates the velocity of the droplet and/or traveling path of the droplet in the pre-pulse light database.

Figure 17:
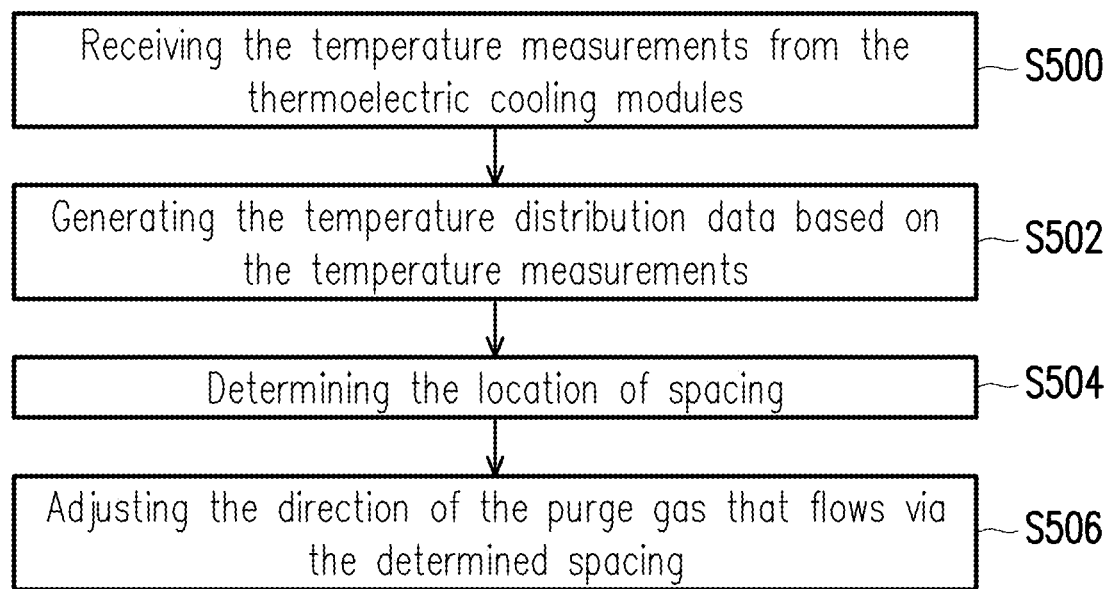
FIG. 17 is a flow chart illustrating a method of adjusting the direction of the purge gas from the spacing S to reduce a likelihood of decomposition of tin hydride ($SnH_4$) created during the self-cleaning process according to one or more embodiments of the present disclosure.

FIG. 17 is a flow chart illustrating a method of adjusting the direction the purge gas to reduce a likelihood of decomposition of tin hydride ($SnH_4$) according to one or more embodiments of the present disclosure.

As discussed above, in some embodiments, temperature measurements taken at each of the thermoelectric cooling modules 408 are transmitted to the processor 306 of the controller 300. In some embodiments, the temperature measurements from the thermoelectric cooling modules 408 are used to determine the direction of the purge gas (e.g., direction toward the collector surface 207). In some embodiments, the temperature measurements from the thermoelectric cooling modules 408 are used to determine the direction of the purge gas in conjunction with the temperature distribution data generated based on the thermal image data. In some embodiments, the temperature distribution data generated based on the thermal image data is used to determine the direction of the purge gas.

Referring to FIG. 17, the method of adjusting the direction of the purge gas to reduce the occurrence of the decomposition of the tin hydride ($SnH_4$) includes: step S500 of receiving the temperature measurements from the thermoelectric cooling modules 408; step S502 of generating the temperature distribution data based on the temperature measurements from the thermoelectric cooling modules 408; step S504 of determining the location of spacing S; and step S506 of adjusting the direction of the purge gas that flows from the determined spacing S.

Step S500 of receiving the temperature measurements from the thermoelectric cooling modules 408 includes a step of receiving the temperature measurements (i.e., temperature data) from each of the thermoelectric cooling modules 408. In some embodiments, the processor 306 of the controller 300 receives the temperature data directly. In some embodiments, the processor 306 received the temperature data indirectly via the PID controller 412.

Step S502 of generating the temperature distribution data based on the temperature measurements from the thermoelectric cooling modules 408 includes a step of generating the temperature distribution data based on the temperature measurements from the thermoelectric cooling modules 408 (i.e., temperature data). Processor 306 further stores the temperature measurements and corresponding locations of the thermoelectric cooling modules 408 (e.g., x-y and x-y-z) as the temperature distribution data in the memory 304.

Step S504 of determining the location of spacing S includes a step of determining a location (or locations) on the collector surface 207 that is predicted to increase its temperature above the predetermined temperature after exposure to the plasma based on the temperature distribution data. In some embodiments, based on the temperature distribution data, the processor 306 determines thermoelectric cooling module 408 transmitted the temperature measurement that is above the predetermined temperature. In some embodiments, based on the temperature distribution data and the collector surface temperature database (stored in the memory 304) that includes temperature history of the collector surface 207, at various locations, before and after the plasma exposure, the processor 306 determines the location on the collector surface 207 that is predicted to increase its temperature above the predetermined temperature after exposure to the plasma. In some embodiments, the processor 306 utilizes one or more artificial intelligence techniques to determine the location. Based on the determined location of the collector surface 207, the processor 306 determines corresponding spacing S in or adjacent to the determined location.

Step S506 of adjusting the direction of the purge gas that flows from the determined spacing S includes a step of adjusting at least one of corresponding flow guide members 713 (shown in FIG. 13), corresponding dispersion members 714 (shown in FIG. 15), or corresponding adjustable dispersion members (shown in FIG. 16).

If the corresponding flow guide members 713 are configured to direct or re-direct the flow of the purge gas from the determined spacing S, the processor 306 transmits a flow guide member control signal to the flow guide members 713 (e.g., hinges 704 or flex points to direct or re-direct the flow of the purge gas) via the output circuitry 308. In a non-limiting example, in response to the flow guide member control signal from the processor 306, the first guide arm 706 and the second guide arm 708 form an angle equal or less than 90 degrees to direct majority of the purge gas toward the collector surface 207.

If the corresponding dispersion members 714 are configured to direct or re-direct the flow of the purge gas from the determined spacing S, the processor 306 transmits a dispersion member control signal to the second guide arm 708 via the output circuitry 308. In a non-limiting example, in response to the dispersion member control signal from the processor 306, the second guide arm member 708 extends into the source vessel 210 to direct majority of the purge gas to the collector surface 207 (shown with h1 in FIG. 14).

If the corresponding adjustable dispersion members 716 are configured to direct or re-direct the flow of the purge gas from the determined spacing S, the processor 306 transmits an adjustable dispersion member control signal to the adjustable dispersion members 716 (e.g., hinges 704 or flex points to direct or re-direct the flow of the purge gas) via the output circuitry 308. In a non-limiting example, in response to the adjustable dispersion member control signal from the processor 306, the angle of the adjustable dispersion members (e.g., V, V', W and W') is 45 degrees or less to direct majority of the purge gas to the collector surface 207.

Utilizing the light source 200 that is able to maintain the intensity of the light (e.g., EUV light) by effectively maintaining the temperature of the collector surface 207 at or below a predetermined temperature (e.g., 50° C. or below) will produce a substantial fabrication cost saving with less defects in the exposure step.

Utilizing the light source 200 that is able to maintain the intensity of the light (e.g., EUV light) by effectively maintaining the temperature of the collector surface 207 at or below a predetermined temperature (e.g., 50° C. or below) will extend the lifetime of the collector 306 by preventing the occurrence of deformation on the collector surface 207 caused by the thermal stresses induced by exposure to the hot plasma generated by the tin excitation.

According to one or more embodiments of the present disclosure, the light source is provided capable of maintaining the temperature of the collector surface at or below a predetermined temperature (e.g., 50° C. or below). The light source in accordance with various embodiments of the present disclosure includes a processor, a droplet generator for generating a droplet, a collector for reflecting extreme ultraviolet light into an intermediate focus point, a light generator for generating pre-pulse light and main pulse light; and a thermal image capture device for capturing a thermal image from a reflective surface of the collector. The droplet generates the extreme ultraviolet light in response to the droplet being illuminated with the pre-pulse light and the main pulse light.

According to one or more embodiments of the present disclosure, the light source is provided capable of maintaining the temperature of the collector surface at or below a predetermined temperature. The light source in accordance with various embodiments of the present disclosure includes a processor, a droplet generator for generating a droplet, a collector including a reflective surface that reflects extreme ultraviolet light into an intermediate focus point, a light generator for generating pre-pulse light and main pulse light, and a plurality of thermoelectric cooling modules at a plurality of locations on the collector. The droplet generates the extreme ultraviolet light in response to the droplet being illuminated with the pre-pulse light and the main pulse light.

According to one or more embodiments of the present disclosure, a method of generating extreme ultraviolet light for a semiconductor fabrication process includes measuring, at a plurality of locations, a temperature of a collector. The method includes determining, by a processor, an impinging direction of a plasma to the collector surface based on the measuring a temperature of a collector at the plurality of locations. The method further includes adjusting, by the processor, at least one of a velocity of a droplet, a traveling path of the droplet, an illuminating angle of a main pulse light, or an illuminating timing of the main pulse light.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A light source for a photolithography fabrication process, comprising:
   a processor;
   a droplet generator for generating a droplet;
   a collector for reflecting extreme ultraviolet light into an intermediate focus point;
   a light generator for generating pre-pulse light and main pulse light; and
   a thermal image capture device for capturing a thermal image from a reflective surface of the collector,
   wherein the droplet generates the extreme ultraviolet light in response to the droplet being illuminated with the pre-pulse light and the main pulse light.

2. The light source of claim 1, wherein the thermal image capture device creates a thermal image based on infrared radiation emitted from the reflective surface of the collector.

3. The light source of claim 2, wherein the processor analyzes temperature distribution of the reflective surface of the collector based on the thermal image.

4. The light source of claim 1, wherein the processor is configured to adjust an illuminating timing of the main pulse light, the adjustment to the illuminating timing affecting an impinging direction of a plasma, generated from the droplet, to the reflective surface of the collector.

5. The light source of claim 1, wherein the processor is configured to adjust an illuminating angle of the main pulse light, the adjustment to the illuminating angle affecting an impinging direction of a plasma, generated from the droplet, to the reflective surface of the collector.

6. The light source of claim 1, wherein the processor is configured to utilize the thermal image to determine a coldest location on the reflective surface of the collector or determine a location on the reflective surface of the collector that is predicted to maintain its temperature below a predetermined temperature after exposure to a plasma generated from the droplet.

7. The light source of claim 6, wherein the processor is configured to adjust an illuminating timing of the main pulse light, the adjustment in the illuminating timing causing the plasma to impinge on the determined location of the reflective surface of the collector.

8. The light source of claim 6, wherein the processor is configured to adjust an illuminating angle of the main pulse light, the adjustment in the illuminating angle of the main pulse of light causing the plasma to impinge on the determined location of the reflective surface of the collector.

9. The light source of claim 6, wherein the processor is configured to adjust an illuminating angle of the main pulse light and adjust an illuminating timing of the main pulse, the adjustment in the illuminating angle of the main pulse light and the adjustment in the illuminating timing of the main pulse light causing the plasma to impinge on the determined location of the reflective surface of the collector.

10. The light source of claim 6, wherein the processor is configured to adjust a velocity of the droplet, the adjustment in the velocity of the droplet causing the plasma to impinge on the determined location of the reflective surface of the collector.

11. The light source of claim 6, wherein the processor is configured to adjust a traveling path of the droplet, the adjustment in the traveling path of the droplet causing the plasma to impinge on the determined location of the reflective surface of the collector.

12. The light source of claim 6, wherein the processor is configured to adjust a velocity and a traveling path of the droplet, the adjustment in the velocity of the droplet and the adjustment in the traveling path of the droplet causing the plasma to impinge on the determined location of the reflective surface of the collector.

13. The light source of claim 6, wherein the predetermined temperature is <50° C.

14. A light source for a photolithography fabrication process, comprising:
   a processor;
   a droplet generator for generating a droplet;
   a collector including a reflective surface that reflects extreme ultraviolet light into an intermediate focus point;
   a light generator for generating pre-pulse light and main pulse light; and
   a plurality of thermoelectric cooling modules at a plurality of locations on the collector,
   wherein the droplet generates the extreme ultraviolet light in response to the droplet being illuminated with the pre-pulse light and the main pulse light.

15. The light source of claim 14, wherein each of the plurality of thermoelectric cooling modules transmits temperature measurements at the plurality of locations.

16. The light source of claim 15, wherein the processor is configured to utilize the temperature measurements to determine a coldest location on the reflective surface of the collector or determine a location on the reflective surface of collector that is predicted to maintain its temperature below a predetermined temperature after exposure to a plasma generated from the droplet.

17. The light source of claim 16, wherein the processor is configured to adjust at least one of an illuminating angle of the main pulse light or an illuminating timing of the main pulse light, the adjustment in the illuminating angle of the main pulse of light causing the plasma to impinge on the determined location of the reflective surface of the collector, the adjustment in the illuminating timing causing the plasma to impinge on the determined location of the reflective surface of the collector.

18. The light source of claim 16, wherein the processor adjusts at least one of a velocity of the droplet or a traveling path of the droplet, the adjustment in the velocity of the droplet causing the plasma to impinge on the determined location of the reflective surface of the collector, the adjustment in the traveling path of the droplet causing the plasma to impinge on the determined location of the reflective surface of the collector.

19. A method of generating extreme ultraviolet light for a semiconductor fabrication process, the method comprising:
   measuring, at a plurality of locations, a temperature of a collector;
   determining, by a processor, an impinging direction of a plasma to the collector surface based on the measuring the temperature of the collector at the plurality of locations; and
   adjusting, by the processor, at least one of a velocity of a droplet, a traveling path of the droplet, an illuminating angle of a main pulse light, or an illuminating timing of the main pulse light.

20. The method according to claim 19, wherein the measuring, at the plurality of locations, the temperatures of the collector is performed by either a thermal image capture device or plurality of thermoelectric cooling modules, or both.

* * * * *